US006542976B2

(12) United States Patent
Barth et al.

(10) Patent No.: US 6,542,976 B2
(45) Date of Patent: Apr. 1, 2003

(54) MEMORY DEVICE HAVING AN INTERNAL REGISTER

(75) Inventors: Richard Maurice Barth; Mark Alan Horowitz, both of Palo Alto; Craig Edward Hampel, San Jose; Frederick Abbot Ware, Los Altos Hills, all of CA (US)

(73) Assignee: Rambus Inc., Los Altos, CA (US)

( * ) Notice: Subject to any disclaimer, the term of this patent is extended or adjusted under 35 U.S.C. 154(b) by 12 days.

(21) Appl. No.: 09/583,111

(22) Filed: May 23, 2000

(65) Prior Publication Data

US 2001/0042182 A1 Nov. 15, 2001

Related U.S. Application Data

(63) Continuation of application No. 08/648,300, filed on May 7, 1996, now Pat. No. 6,209,071.

(51) Int. Cl.[7] .............................................. G06F 13/14
(52) U.S. Cl. ...................................... 711/167; 711/105
(58) Field of Search ................................ 711/104, 105, 711/167, 168, 169; 713/400, 401, 500, 501

(56) References Cited

U.S. PATENT DOCUMENTS

| | | | | |
|---|---|---|---|---|
| 4,293,932 A | 10/1981 | McAdams | ................ | 365/222 |
| 4,334,295 A | 6/1982 | Nagami | .................... | 365/222 |
| 4,388,686 A | 6/1983 | Haid | ........................ | 364/200 |
| 4,484,308 A | 11/1984 | Lewandowski et al. | ...... | 364/900 |
| 4,485,461 A | 11/1984 | Kobayashi | ................ | 365/239 |
| 4,536,795 A | 8/1985 | Hirota et al. | .............. | 358/160 |
| 4,617,647 A | 10/1986 | Hoshi | ...................... | 365/189 |
| 4,649,522 A | 3/1987 | Kirsch | ..................... | 365/189 |
| 4,694,197 A | 9/1987 | Sprague | ................... | 307/269 |
| 4,734,880 A | 3/1988 | Collins | ..................... | 364/900 |
| 4,792,929 A | 12/1988 | Olson et al. | ............... | 365/233 |
| 4,800,530 A | 1/1989 | Itoh et al. | ................. | 365/189 |
| 4,823,324 A | 4/1989 | Taylor et al. | ............... | 365/230 |
| 4,825,411 A | 4/1989 | Hamano | .................... | 365/189 |
| 4,831,597 A | 5/1989 | Fuse | ......................... | 365/233 |
| 4,833,656 A | 5/1989 | Tobita | ................... | 365/230.06 |
| 4,839,856 A | 6/1989 | Tanaka | ....................... | 364/900 |
| 4,875,192 A | 10/1989 | Matsumoto | ................ | 365/193 |
| 4,901,036 A | 2/1990 | Herold et al. | ................ | 331/25 |

(List continued on next page.)

FOREIGN PATENT DOCUMENTS

| | | |
|---|---|---|
| EP | 0561370 | 3/1992 |
| JP | 57-14922 | 1/1982 |
| JP | 62-71428 | 3/1987 |

OTHER PUBLICATIONS

JC–42.3 Committee on RAM Memories, Minutes of Meeting No. 72 Sep. 13, 1994 Albuquerque, NM pp. 1–13, Presentation made by NEC "NEC SDRAM Mode Register Item 639" and Attachment "AA".

(List continued on next page.)

*Primary Examiner*—Kevin L. Ellis
(74) *Attorney, Agent, or Firm*—Jose G. Moniz

(57) ABSTRACT

A method and system for transferring information within a computer system is provided. The system includes a memory device that has a lower power mode in which data transfer circuitry is not driven by a clock signal, and a higher power mode in which data transfer circuitry is driven by a clock signal. The system further includes a memory controller that sends control signals to the memory device to initiate a data transfer transaction. The memory device receives the control signals asynchronously, and assumes the second mode in response to one of the control signals. While the memory device is in the second mode, the memory controller sends a control signal to identify a particular clock cycle. The memory device synchronously transfers the data. The memory device determines when to begin the data transfer based on the identified clock cycle and the type of data transfer that has been specified.

30 Claims, 13 Drawing Sheets

U.S. PATENT DOCUMENTS

| | | | |
|---|---|---|---|
| 4,901,282 A | 2/1990 | Kobayashi | 365/222 |
| 4,979,145 A | 12/1990 | Remington et al. | 364/900 |
| 5,007,028 A | 4/1991 | Ohshima et al. | 365/233 |
| 5,034,917 A | 7/1991 | Bland et al. | 364/900 |
| 5,077,693 A | 12/1991 | Hardee et al. | 365/230.08 |
| 5,083,296 A | 1/1992 | Hara et al. | 365/230.02 |
| 5,088,062 A | 2/1992 | Shikata | 365/189.05 |
| 5,099,481 A | 3/1992 | Miller | 714/724 |
| 5,111,386 A | 5/1992 | Fujishima et al. | 395/425 |
| 5,124,589 A | 6/1992 | Shiomi et al. | 307/465 |
| 5,140,688 A | 8/1992 | White et al. | 713/600 |
| 5,150,329 A | 9/1992 | Hoshi | 365/222 |
| 5,173,878 A | 12/1992 | Sakui et al. | 365/230.02 |
| 5,179,687 A | 1/1993 | Hidaka et al. | 395/425 |
| 5,185,719 A | 2/1993 | Dhong et al. | 365/189.01 |
| 5,193,072 A | 3/1993 | Frenkil et al. | 365/222 |
| 5,202,857 A | 4/1993 | Yanai et al. | 365/233 |
| 5,218,572 A | 6/1993 | Lee et al. | 365/200 |
| 5,218,686 A | 6/1993 | Thayer | 395/425 |
| 5,226,147 A | 7/1993 | Fujishima et al. | 395/425 |
| 5,249,277 A | 9/1993 | Leftwich et al. | 395/400 |
| 5,249,282 A | 9/1993 | Segers | 395/425 |
| 5,258,953 A | 11/1993 | Tsujimoto | 365/200 |
| 5,260,905 A | 11/1993 | Mori | 365/230.05 |
| 5,267,200 A | 11/1993 | Tobita | 365/189.05 |
| 5,268,865 A | 12/1993 | Takasugi | 365/189.05 |
| 5,274,788 A | 12/1993 | Koike | 395/425 |
| 5,276,858 A | 1/1994 | Oak et al. | 395/550 |
| 5,278,789 A | 1/1994 | Inoue et al. | 365/189.01 |
| 5,278,792 A | 1/1994 | Inoue et al. | 365/193 |
| 5,287,327 A | 2/1994 | Takasugi | 365/230.02 |
| 5,291,444 A | 3/1994 | Scott et al. | 365/189.05 |
| 5,293,340 A | 3/1994 | Fujita | 365/201 |
| 5,299,169 A | 3/1994 | Miyamoto | 365/230.05 |
| 5,305,278 A | 4/1994 | Inoue | 365/230.03 |
| 5,307,320 A | 4/1994 | Farrer et al. | 365/230.01 |
| 5,307,469 A | 4/1994 | Mann | 395/425 |
| 5,311,483 A | 5/1994 | Takasugi | 365/233 |
| 5,313,431 A | 5/1994 | Uruma et al. | 365/230.05 |
| 5,319,755 A | 6/1994 | Farmwald et al. | 395/325 |
| 5,323,358 A | 6/1994 | Toda et al. | 365/230.09 |
| 5,325,329 A | 6/1994 | Inoue et al. | 365/189.05 |
| 5,327,390 A | 7/1994 | Takasugi | 365/230 |
| 5,335,336 A | 8/1994 | Kametani | 395/425 |
| 5,337,285 A | 8/1994 | Ware et al. | 365/227 |
| 5,339,276 A | 8/1994 | Takasugi | 365/230.02 |
| 5,341,341 A | 8/1994 | Fukuzo | 365/222 |
| 5,341,488 A | 8/1994 | Kobayashi | 395/425 |
| 5,343,438 A | 8/1994 | Choi et al. | 365/233 |
| 5,347,491 A | 9/1994 | Kagami | 365/222 |
| 5,349,566 A | 9/1994 | Merritt et al. | 365/233.5 |
| 5,353,253 A | 10/1994 | Nakajima | 365/200 |
| 5,353,427 A | 10/1994 | Fujishima et al. | 395/425 |
| 5,355,348 A | 10/1994 | Ooishi | 365/230.06 |
| 5,365,489 A | 11/1994 | Jeong | 365/230.03 |
| 5,367,493 A | 11/1994 | Yamagata | 365/222 |
| 5,379,259 A | 1/1995 | Fujita | 365/200 |
| 5,379,263 A | 1/1995 | Ogawa et al. | 365/230.04 |
| 5,381,367 A | 1/1995 | Kajimoto | 365/189.01 |
| 5,381,376 A | 1/1995 | Kim et al. | 365/230.03 |
| 5,384,735 A | 1/1995 | Park et al. | 365/189.05 |
| 5,384,737 A | 1/1995 | Childs et al. | 365/189.05 |
| 5,384,745 A | 1/1995 | Konishi et al. | 365/230.03 |
| 5,386,385 A | 1/1995 | Stephens, Jr. | 365/189.05 |
| 5,390,149 A | 2/1995 | Vogley et al. | 365/189.01 |
| 5,392,239 A | 2/1995 | Margulis et al. | 365/189.01 |
| 5,394,373 A | 2/1995 | Kawamoto | 365/230.06 |
| 5,400,292 A | 3/1995 | Fukiage et al. | 365/230.01 |
| 5,402,388 A | 3/1995 | Wojcicki et al. | 365/233 |
| 5,404,335 A | 4/1995 | Tobita | 365/222 |
| 5,404,338 A | 4/1995 | Murai et al. | 365/233 |
| 5,410,514 A | 4/1995 | Miyatake | 365/238.5 |
| 5,416,743 A | 5/1995 | Allan et al. | 365/203 |
| 5,416,918 A | 5/1995 | Gleason et al. | 395/550 |
| 5,421,000 A | 5/1995 | Fortino et al. | 395/425 |
| 5,424,983 A | 6/1995 | Wojcicki et al. | 365/189.05 |
| 5,426,333 A | 6/1995 | Maeda | 327/536 |
| 5,426,606 A | 6/1995 | Takai | 365/189.05 |
| 5,428,573 A | 6/1995 | Watanabe | 365/200 |
| 5,430,683 A | 7/1995 | Hardin et al. | 365/227 |
| 5,430,688 A | 7/1995 | Takasugi | 365/233 |
| 5,430,859 A | 7/1995 | Norman et al. | 395/425 |
| 5,438,548 A | 8/1995 | Houston | 365/227 |
| 5,440,511 A | 8/1995 | Yamamoto et al. | 365/189.05 |
| 5,440,515 A | 8/1995 | Chang et al. | 365/194 |
| 5,444,667 A | 8/1995 | Obara | 365/233 |
| 5,455,803 A | 10/1995 | Kodama | 365/233 |
| 5,615,376 A | 3/1997 | Ranganathan | 395/750 |
| 5,625,796 A | 4/1997 | Kaczmarczyk et al. | 395/495 |
| 5,655,113 A | 8/1997 | Leung et al. | 395/552 |
| 5,778,419 A | 7/1998 | Hansen et al. | 711/112 |
| 6,065,092 A | 5/2000 | Roy | 711/5 |
| 6,067,272 A | 5/2000 | Foss et al. | 365/233 |

OTHER PUBLICATIONS

Moussouris, J. "The Advanced Systems Outlook–Life Beyond RISC: The next 30 years in high–performance computing", Computer Letter, Jul. 31, 1989 (an edited excerpt from an address at the fourth annual conference on the Advanced Systems Outlook, in San Francisco, CA (Jun. 5).

Knut Alnes, "Scalable Coherent Interface", SCI–Feb89–doc52, Norsk Data, Olso, Norway, pp. 1–8, May 10, 1989.

Hansen et al., "A RISC Microprocessor with Integral MMU and Cache Interface", MIPS Computer Systems, Sunnyvale, CA, IEEE 1986 pp 145–148.

Moussouris et al., "A CMOS Processor With Integrated Systems Functions", MIPS Computer Systems, Sunnyvale, CA, IEEE 1986 pp 126–130.

J. Sonntag et al. "A Monolithic CMOS 10MHz DPLL for Burst–Mode Data Retiming", IEEE International Solid State Circuits Conference (ISSCC) Feb. 16, 1990.

M. Johnson et al., "A Variable Delay Line PLL for CPU–Coprocessor Synchronization", IEEE Journal of Solid–State Circuits, vol. 23, No. 5, pp. 1218–1223, (Oct. 1988).

N Kushiyama et al., "A 500–Megabyte/s Data–Rate 4.5M DRAM", IEEE Journal of Solid–State Circuits, vol 28, No. 4, pp. 490–498, (Apr. 1993).

T. Lee et al., "A 2.5V CMOS Delay–Locked Loop for an 18Mbit, 500Megabyte/s DRAM", IEEE Journal of Solid–State Circuits, vol., 29, No. 12, pp. 1491–1496, (Dec. 1994).

MOSYS, "MD904 to MD920, Multibank DRAM (MDRAM) 128Kx32 to 656Kx32" Datasheet, Document DS01–2.1, MoSys Inc. California, Dec. 18, 1995, pp. 1–14.

J. Atwood, "NEC 18Mb Rambus DRAM Core Interface", Draft of Aug. 9, 1992.

"Rambus Interface tEchnical Description–Version 4.2", Draft of Aug. 19, 1992, Rambus Inc., pp. 177–207.

J. Atwood, "p5 18M RDRAM Test Modes", Rambus Inc. Draft of Aug. 3, 1992, pp. 1–14.

Gutierrez et al., "An Integrated PLL Clock Generator for 275 MHz Graphic Displays", I.E.E.E. Custon Integrated Circuits Conference, 1990.

"ICs for Entertainment Electronics, Picture System, Edition 8.89", Seimens A.G. Germany, 1989.

S. A. Przybylski, "New DRAM Technologies, A Comprehensive Analysis of the New Architectures", Micro Design Resources, copyright 1994 pp. 123–216, and pp. 451–544.

F. A. Ware, "RDRAM Design Guide", Rambus Inc. Copyright 1995, pp. 1–114.

"Rambus Interface Technical Description, Version 4.2 –Preliminary", Rambus Inc, 1992, pp. 1–208.

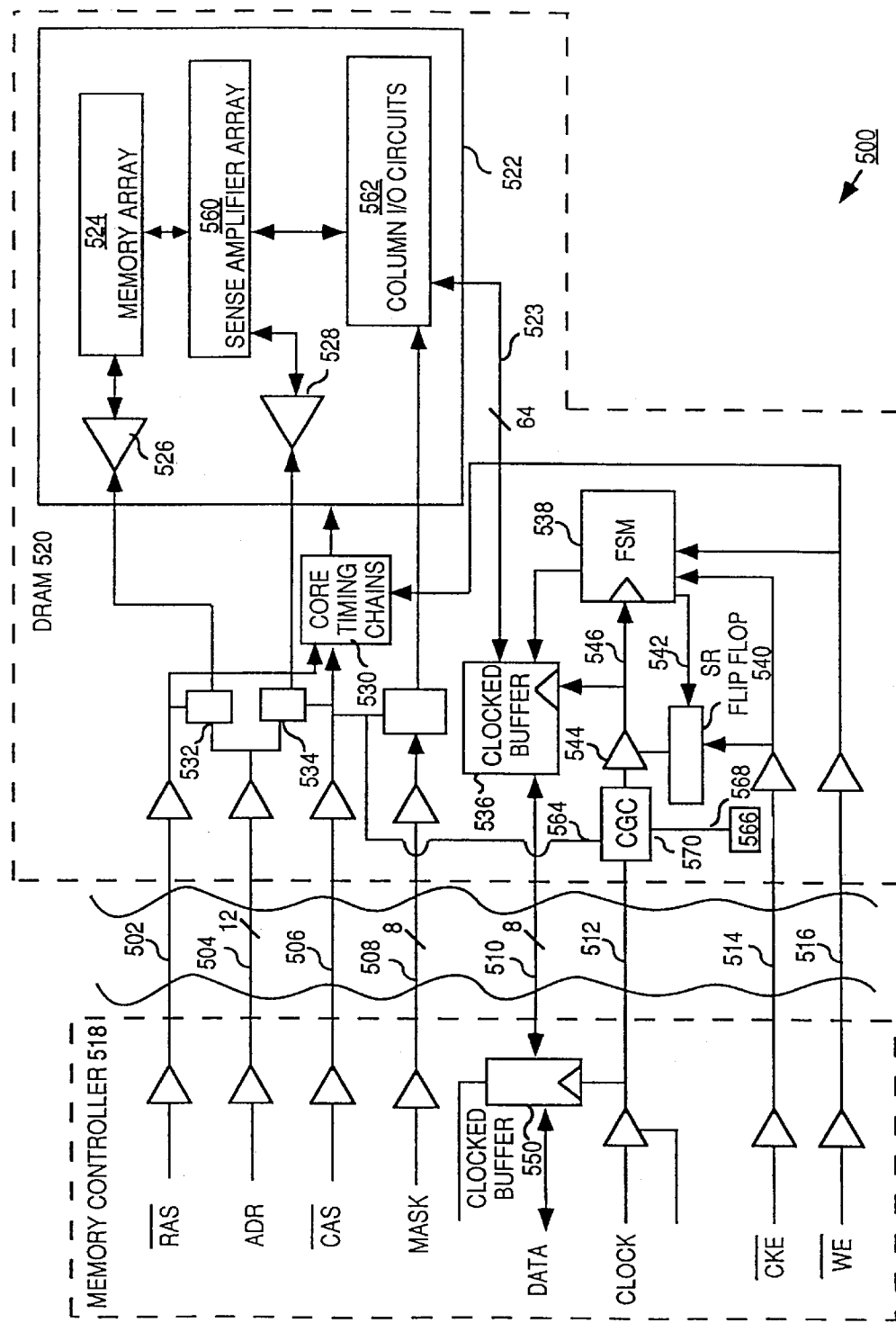

MEMORY DEVICE HAVING AN INTERNAL REGISTER

This is a continuation of application Ser. No. 08/648,300, filed on May 7, 1996, that is now U.S. Pat. No. 6,209,071.

FIELD OF THE INVENTION

The present invention relates to digital storage devices, and more specifically, to dynamic random access memory.

BACKGROUND OF THE INVENTION

Improvements in fabrication technology have resulted in dynamic random access memories (DRAMs) with increased density, faster performance, and higher operating frequencies. Because overall memory bandwidth requirements are rising and the number of DRAMs in a system is falling, the ability to quickly transport data to and from each DRAM has become increasingly important. ASYNCHRONOUS DRAMS In conventional memory systems, the communication between a memory controller and DRAMs is performed through asynchronous communications. For example, the memory controller uses control signals to indicate to the DRAM when requests for data transactions are sent. The data transfers themselves are also performed asynchronously. To meet increased speed requirements, various enhanced asynchronous memory systems have been developed. One such system is the Extended Data Out (EDO) DRAM memory system.

FIG. 1 is a block diagram illustrating a typical EDO DRAM system 100. In the EDO DRAM system 100, data transfers are performed asynchronously in response to control signals and addresses sent from pin buffers 116 of a memory controller to pin buffers 118 of the EDO DRAM over a plurality of lines 120, 122, 124, 134 and 136. Specifically, lines 122 carry an address that is stored in latches 112 and 114. Line 120 carries a row address strobe ($\overline{RAS}$) that controls when the address stored in latch 112 is sent to row decoder 106. Line 134 carries an output enable signal that controls data output of the DRAM. Line 136 carries a write enable signal that controls timing chains 108 and the direction of data flow on the bi-directional data bus 126.

Upon receiving an address, row decoder 106 loads data that corresponds to the address from a memory array 110 in memory core 102 into a sense amplifier array 130. Line 124 carries a column address strobe ($\overline{CAS}$) that controls when the address stored in latch 114 is sent to column decoder 104. For a read operation, the column decoder 104 causes the data that is stored in the columns of the sense amplifier array 130 that correspond to the address received by column decoder 104 to be transferred through column I/O circuits 132. The data passes through the column I/O circuits 132 to the memory controller over a data bus 126.

Alternately, an EDO DRAM may use address transition detect circuitry to initiate the retrieval of data from the memory core, rather than the $\overline{CAS}$ signal. Address transition detect circuitry is circuitry that monitors the address bus to detect transitions in the data that is being sent on the address bus. When a transition is detected, the EDO DRAM restarts the timing chains causing data corresponding to a new address to fall out of the column I/O circuits 132.

The communication between the EDO DRAM and the memory controller is asynchronous. Thus, the EDO DRAM is not driven by an external clock. Rather, timing chains 108 that are activated by the $\overline{RAS}$ and $\overline{CAS}$ control signals are used to control the timing of the data transfer. Because the core 102 is not driven unless activated by the $\overline{RAS}$ and $\overline{CAS}$ control signals, the core 102 does not consume energy unless a data transfer operation is taking place. Therefore, the EDO DRAM consumes less power than alternative architectures in which the interface is clocked even when no memory operation is being performed.

FIG. 2 is a timing diagram for a read operation in EDO system 100. At time T0 the memory controller places on lines 122 an address that indicates the bank and row from which data is to be read. At time T1 the $\overline{RAS}$ signal goes LOW causing the address to be sent from latch 112 to row decoder 106. In response, row decoder 106 causes the appropriate row of data to be transferred from memory array 110 to sense amplifier array 130.

At time T2 the memory controller places on lines 122 the address of the column from which data is to be read. At time T3 the $\overline{CAS}$ signal goes LOW causing the address to be sent from latch 114 to column decoder 104. In response, column decoder 104 sends through column I/O circuits 132 data from the selected column of the row stored in sense amplifier array 130. Assuming that $\overline{WE}$ is HIGH and $\overline{OE}$ is LOW, the data will appear on data bus 126. The data on the data bus 126 takes some time to stabilize. To ensure an accurate reading, the memory controller does not read the data from the data bus until time T4.

The delay between the time at which the $\overline{RAS}$ signal goes LOW to initiate a read operation and the time at which the data may be read from the data bus 126 is identified as $t_{RAC}$. The delay between the time at which the $\overline{CAS}$ signal goes LOW for a read operation and the time at which the data may be read from the data bus 126 is identified as $t_{CAC}$. The delay between the time at which the column address is placed on the address bus and the time at which the data may be read from the data bus 126 is identified as $t_{CAA}$. In a typical EDO DRAM, exemplary times are $t_{CAC}$=15 ns and $t_{CAA}$=30 ns.

In one variation, the memory controller is allowed to have column address flow through. The memory controller therefore has until T3 (the fall of $\overline{CAS}$), rather than until T2 (the transmission of the column address), to decide whether to perform a given transaction. In the exemplary times above, the memory controller would have 15 ns more time to decide whether to perform a given transaction.

SYNCHRONOUS DRAMS

DRAMs built with an asynchronous RAS/CAS interface have difficulty meeting the high memory bandwidth demands of many current computer systems. As a result, synchronous interface standards have been proposed. These alternative interface standards include Synchronous DRAMs (SDRAMs). In contrast to the asynchronous interface of EDO DRAMS, SDRAM systems use a clock to synchronize the communication between the memory controller and the SDRAMs. Timing communication with a clock allows data to be placed on the DRAM output with more precise timing. In addition, the clock signal can be used for internal pipelining. These characteristics of synchronous communication results in higher possible transfer rates.

FIG. 3 is a block diagram illustrating a conventional SDRAM system 300. In system 300, the memory controller includes a plurality of clocked buffers 304 and the SDRAM includes a plurality of clocked buffers 306. Data from control line 310 and an address bus 312 are received by a finite state machine 308 in the SDRAM. The output of the finite state machine 308 and the address data are sent to memory array 302 to initiate a data transfer operation.

FIG. 4 is a timing diagram that illustrates the signals generated in system 300 during a read operation. At time T0 the memory controller places a read request on line 310 and an address on bus 312. At time T1 the SDRAM reads the information on lines 310 and 312. Between T1 and 12 the SDRAM retrieves the data located at the specified address from memory array 302. At time T2 the SDRAM places data from the specified address on data bus 314. At time T3 the memory controller reads the data off the data bus 314.

Because system 300 is synchronous, various issues arise that do not arise in asynchronous systems. Specifically, the synchronous system has numerous pipeline stages. Unbalanced pipeline stages waste computational time. For example, if a shorter pipeline stage is fed by a longer pipeline stage, there will be some period of time in which the shorter pipeline stage remains idle after finishing its operation and before receiving the next set of data from the preceding pipeline stage. Similarly, if a short pipeline stage feeds a longer pipeline stage, the shorter pipeline stage must wait until the longer pipeline stage has completed before feeding the longer pipeline stage with new input.

Each stage in the pipeline must allow for the setup, clock transition, and clock-to-out-put time of the flip-flop that is dividing the stages. Typically the execution time of each step is not substantially larger than the sum of these overheads, so the latency is significantly increased by them. Further, the memory controller may be running from a clock of a different frequency and/or phase from the DRAM subsystem clock. Crossing the boundaries between these clocks requires a time proportional to the clock frequencies. In addition, the architecture must take into account jitter that occurs when various data queues are clocked.

In general, the synchronous nature of the SDRAM architecture gives SDRAMs higher transfer rates than EDO DRAMs. However, the higher rates are achieved at the expense of increased latency and power consumption. Specifically, the time required to clock control and address data through various pipeline stages increases the delay between when an address for a read operation is transmitted and when the data from the specified address is actually supplied by the SDRAM.

The increased overhead (OV) that results from the use of synchronous transfer rather than an asynchronous transfer can be expressed by the formula OV=SD+($T_{DC}$−D1)+($T_{DC}$−D3)+($T_{DC}$−(D2 MOD TDC)), SD is synchronization delay, $T_{DC}$ is the time period of the DRAM clock, $D_1$ is the delay due to controller-to-DRAM time of flight, $D_2$ is the time to perform a CAS operation, $D_3$ is the delay due to DRAM-to-controller time of flight, and ($D_2$MOD $T_{DC}$) is the remainder of ($D_2/T_{DC}$). SD is typically equal to ($T_{DC}$+$T_{CC}$), where $T_{CC}$ is the duration of the controller clock cycle. In a system in which the external clock is at 66 Mhz and the DRAM subsystem clock is at 83 Mhz, typical values may be: $T_{DC}$ is 12 ns, TCC is 15 ns, $D_1$ is 6 ns, $D_2$ is 35 ns, and $D_3$ is 6 ns. Thus, a typical OV would be (15+12)+(12−6)+(12−6)+(12−11)=40 ns.

Further, systems that use SDRAMs typically consume more power than the systems that use EDO DRAMs because, when the clock is enabled, the SDRAM interface is clocked whether or not a data transfer operation is actually being performed. For example, under typical conditions SDRAMs in an idle state consume approximately two to ten times more energy than EDO DRAMs in an idle state. When the clock is disabled, the clock must be enabled before a data transfer operation can be performed. More specifically, the clock must be enabled before any address or control information can be sampled by the SDRAM. The time used to enable the clock signal further increases the delay between the time that data is desired and the time that the requested data is available.

SUMMARY AND OBJECTS OF THE INVENTION

One object of the invention is to provide a memory system with an improved balance between request-to-data latency, power consumption and bandwidth.

According to one aspect of the invention, a memory interface is provided that maintains the high-bandwidth of synchronous systems, while reducing the latency and power requirements of these systems. This is accomplished by using an asynchronous interface for the address and control information, and using a synchronous interface for fast data transport.

According to one aspect of the invention, a controller transmits control signals requesting a data transfer to a memory device. The memory device asynchronously receives the control signals and synchronously performs the requested data transfer.

The memory device has a first mode in which data transfer circuits within the memory device are not driven by an internal clock signal. The memory device has a second mode in which data transfer circuits within the memory device are driven by the internal clock signal.

The memory device asynchronously receives the control signals. If the memory device is in the first mode, the memory device may assume the second mode in response to one or more of the control signals from a memory controller. While in the second mode, the memory device transfers data with the data transfer circuits while the data transfer circuits are being driven by the internal clock signal. The memory device is also able to asynchronously perform data transfers while the memory device is in the first mode.

The internal clock signal is generated from an external clock signal that may selectively pass through a delay lock loop within the memory device. The memory device may support higher clock frequencies when the external clock signal passes through the delay lock loop to drive the data transfer circuits during a data transfer. Energy may be saved by circumventing the delay lock loop and using an external clock signal with a relatively slower frequency to drive the data transfer circuits during a data transfer.

BRIEF DESCRIPTION OF THE DRAWINGS

The present invention is illustrated by way of example, and not by way of limitation, in the figures of the accompanying drawings and in which like reference numerals refer to similar elements and in which:

FIG. 5a is a block diagram illustrating a memory system according to an embodiment of the present invention;

FIG. 6 is a timing diagram illustrating the timing of signals when a read operation is performed in the memory system of FIG. 5a;

FIG. 7 is a timing diagram illustrating the timing of signals when a write operation is performed in the memory system of FIG. 5a;

FIG. 8 is a flow chart illustrating the steps performed by a DRAM during a data transfer in the memory system shown in FIG. 5a;

DETAILED DESCRIPTION OF THE PREFERRED EMBODIMENT

Figure 1:
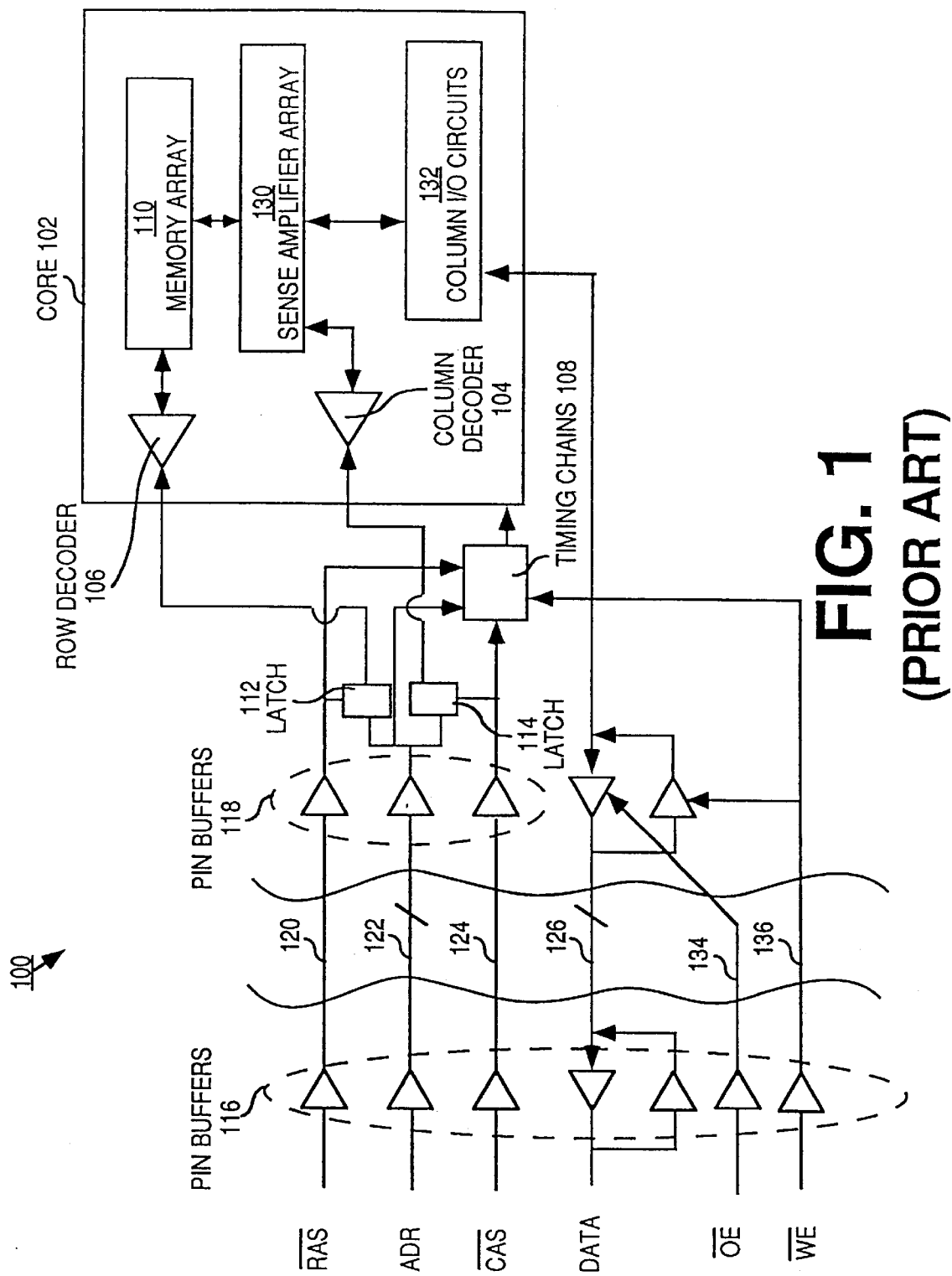
FIG. 1 is a block diagram illustrating a prior art EDO DRAM system.
Figure 2:
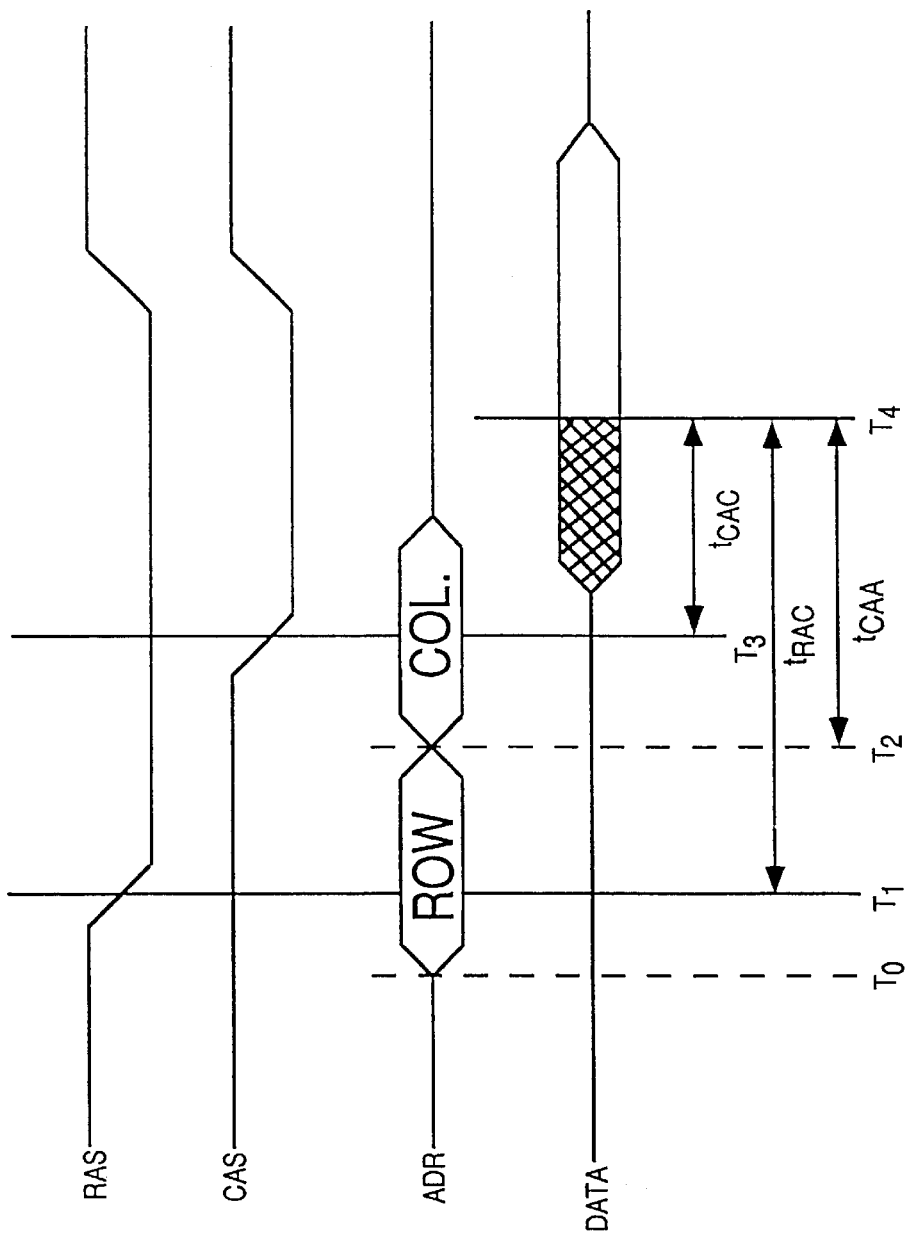
FIG. 2 is a timing diagram illustrating the timing of signals when a read operation is performed in the EDO DRAM system of FIG. 1.
Figure 3:
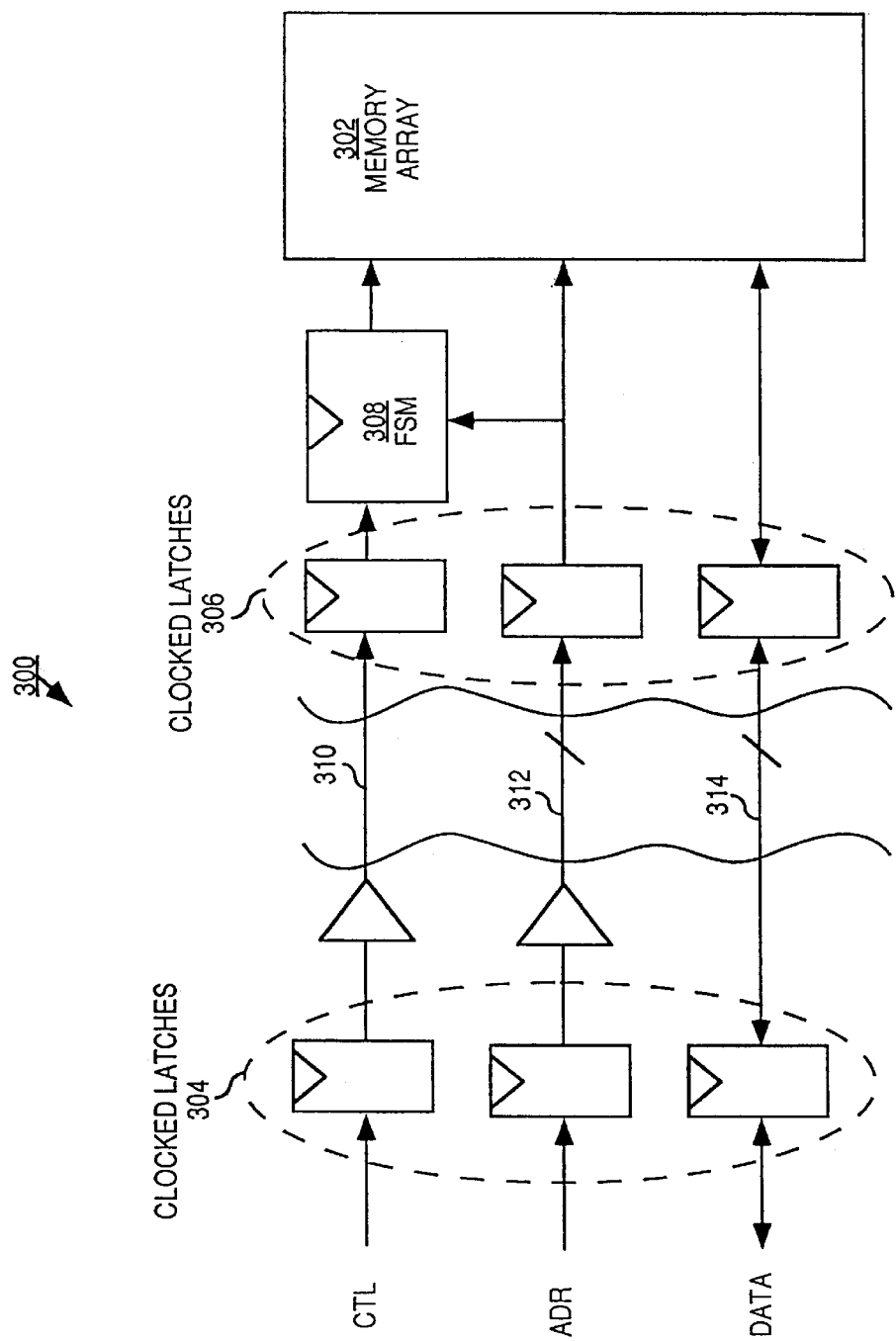
FIG. 3 is a block diagram illustrating a prior art SDRAM system.
Figure 4:
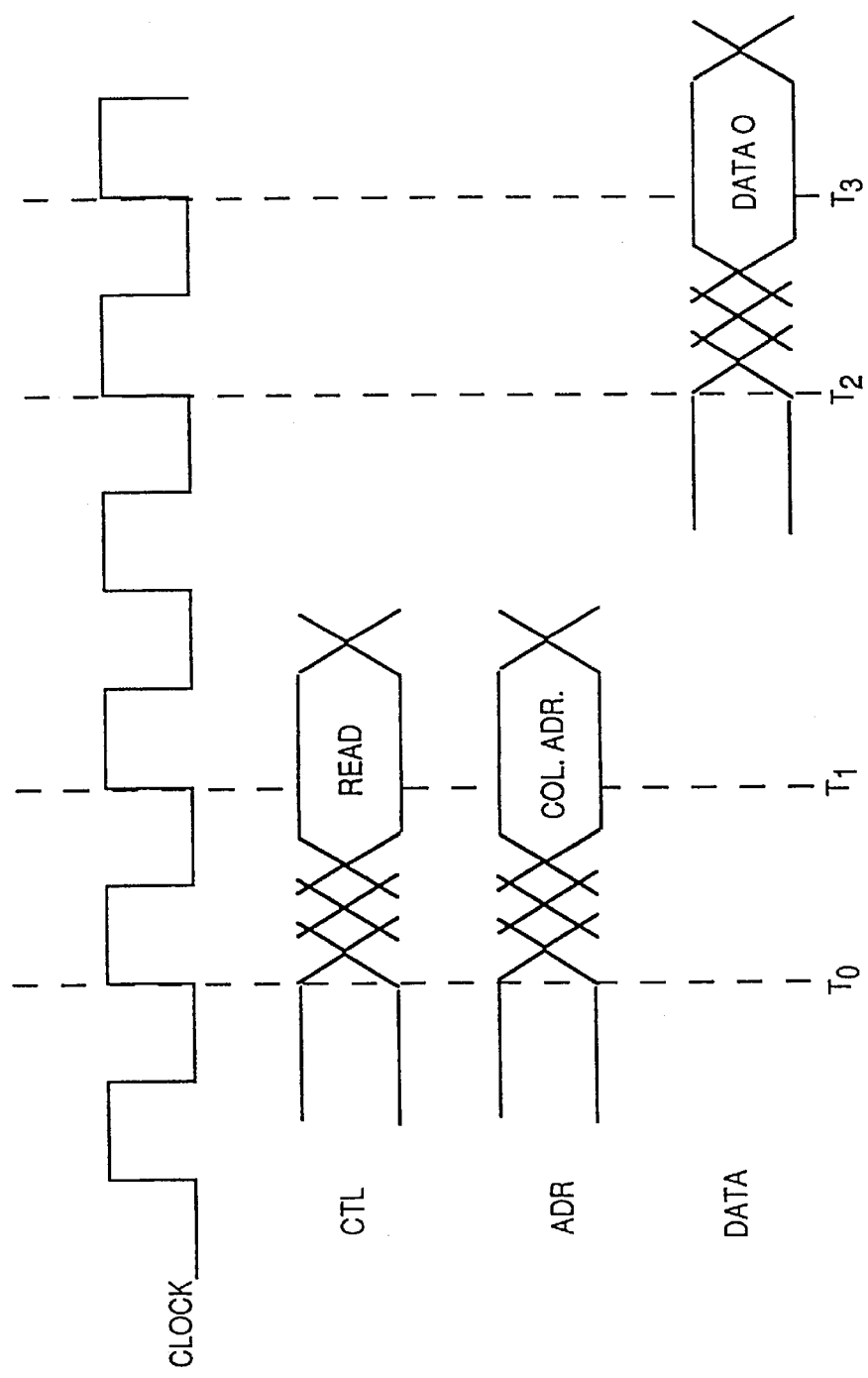
FIG. 4 is a timing diagram illustrating the timing of signals when a read operation is performed in the SDRAM system of FIG. 3.

Referring to FIG. 5a, it illustrates a memory system 500 according to one embodiment of the invention. System 500 includes a memory controller 518 coupled to a DRAM 520 by a plurality of lines. The lines connecting memory controller 518 to DRAM 520 include a $\overline{RAS}$ line 502, an address bus 504, a $\overline{CAS}$ line 506, a mask bus 508, a data bus 510, a clock line 512, a clock enable ($\overline{CKE}$) line 514, and a write enable ($\overline{WE}$) line 516.

The DRAM 520 has a core 522 that includes a memory array 524, a sense amplifier array 560, column I/O circuits 562, a row decoder 526 and a column decoder 528. DRAM 520 further includes core timing chains 530, latches 532 and 534, a clocked buffer 536, a finite state machine 538, a flip flop circuit 540 and a clock buffer 544. DRAM 520 further includes a clock generation circuit (CGC) 570 and a mode control circuit 566. As shall be explained in greater detail below, in system 500, data transfers are requested using asynchronous communication, while the actual data transfers performed in response to the requests may be performed using synchronous communication or asynchronous communication, depending on the mode selected by mode control circuit 566.

DRAM 520 illustrates an embodiment that supports at least three data transfer modes: synchronous mode, slow synchronous mode, and asynchronous mode. As shall be described in greater detail hereafter, mode control circuit 566 controls the transfer mode currently in effect in DRAM 520. Mode control circuit 566 may be, for example, a value stored in a register of DRAM 520, or pin coupled to an external control line.

Asynchronous Transfer Control Signals

Figure 6:
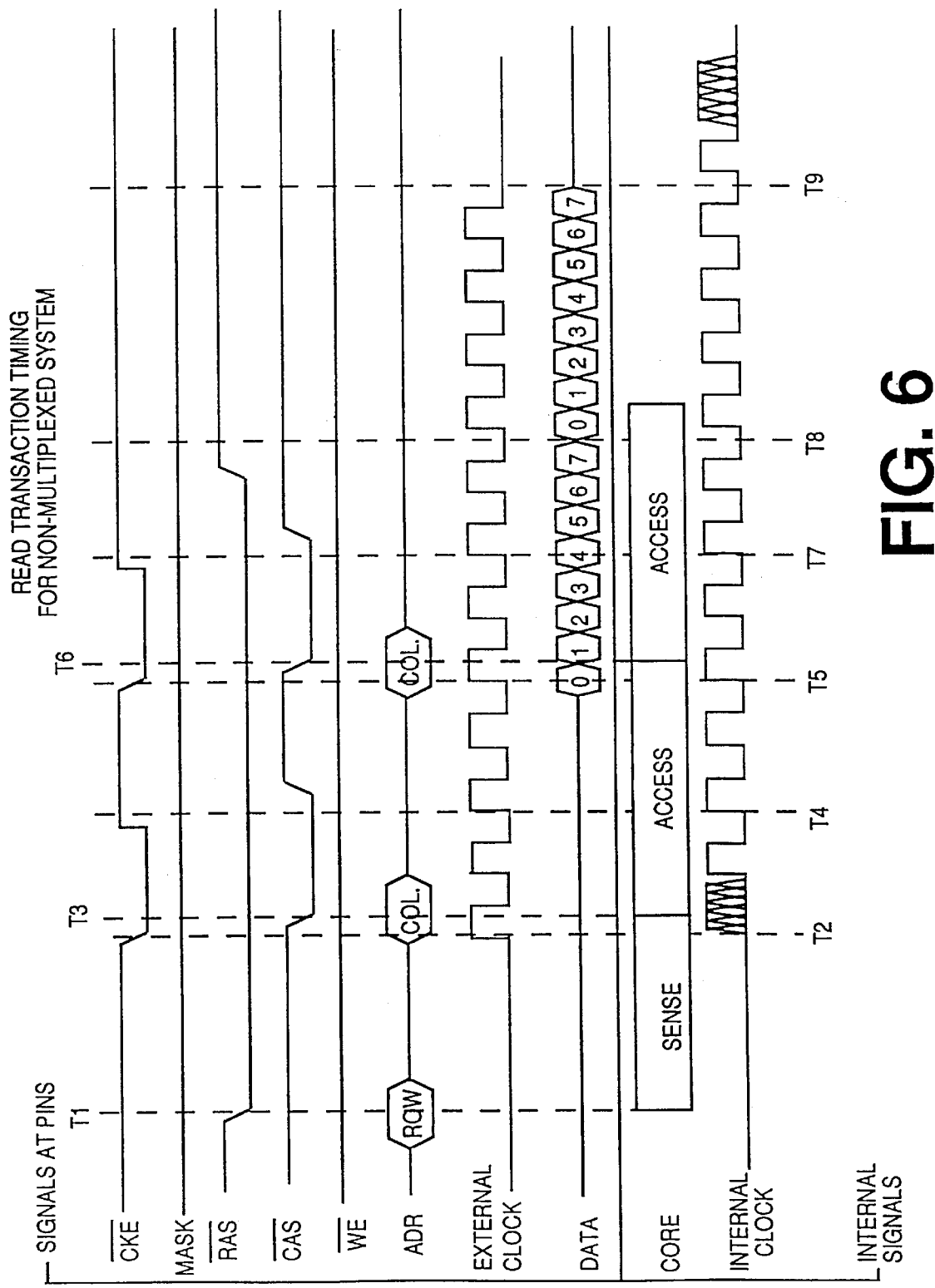

Referring to FIG. 6, it illustrates the timing of signals generated during an exemplary read transaction performed in memory system 500. Initially, the $\overline{CKE}$ line 514 is HIGH, causing the flip flop 540 to turn off the clock buffer 544. When the clock buffer 544 is off, any clock signal on line 512 is prevented from driving the synchronous components of DRAM 520.

Prior to time T1, memory controller 518 transmits a row address over the address bus 504. The row address is loaded into latches 532 and 534. At time T1, memory controller 518 causes the $\overline{RAS}$ signal to go LOW. When the $\overline{RAS}$ line goes LOW, the row address passes through latch 532 and is applied to row decoder 526. For multi-bank devices, row and column addresses include bank address information. Row decoder 526 causes a sense operation to be performed on cells within memory array 524 to load into sense amplifier array 560 the data that corresponds to the specified row address.

Prior to time T3, the memory controller 518 places a column address on the address bus 504. The column address is loaded into latches 532 and 534. At time T3, the memory controller 518 causes the signal on the $\overline{CAS}$ line 506 to go LOW. When the $\overline{CAS}$ signal goes LOW, the column address passes through latch 534 and is applied to column decoder 528. Column decoder 528 causes an access operation to be performed on the data currently stored in the sense amplifier array 560. The data corresponding to the specified column address is sent from sense amplifier array 560 through column I/O circuits 562.

Prior to time T6, the memory controller 518 places a second column address on the address bus 504. The column address is loaded into latches 532 and 534. At time T6, the memory controller 518 causes the signal on the $\overline{CAS}$ line 506 to go LOW. When the $\overline{CAS}$ signal goes LOW, the column address passes through latch 534 and is applied to column decoder 528. Column decoder 528 causes an access operation to be performed on the data currently stored in the sense amplifier array 560. The data corresponding to the specified column address is sent from sense amplifier array 560 through column I/O circuits 562.

Significantly, all of the control information to perform the read transaction is sent without reference to any particular clock cycles. This is true even though the internal clock of DRAM 520 may be active at the time at which some of the control signals are sent by the memory controller 518. For example, the internal clock is active at time T6 when the second column address is latched to the column decoder. However, the timing of the $\overline{CAS}$ signal that causes the column address to be latched and sent to the column decoder does not necessarily have any correlation with the clock signal.

According to an alternate embodiment, the $\overline{RAS}$ and $\overline{CAS}$ signals are well controlled with respect to the clock signal on line 512. In such an embodiment, the request for data is issued from the same time domain as the data transport clock on line 512. The timing of the data transfer may then be determined based on the timing of the control signals.

For example, data transport may begin a predetermined number of clock cycles after the clock cycle on which the falling edge of $\overline{CAS}$ occurs. Various techniques may be used to ensure that the DRAM is aware of the clock cycle on which the falling edge of $\overline{CAS}$ occurred. For example, the memory controller 518 may cause the $\overline{CKE}$ signal to go LOW sufficiently before the falling edge of $\overline{CAS}$ to ensure that the internal clock signal is stabilized by the time the falling edge of $\overline{CAS}$ occurs.

Alternately, if it has been determined exactly how many clock cycles will lapse between the falling edge of $\overline{CKE}$ and the first clock cycle to cause data to be output, the falling edge of $\overline{CKE}$ may be used to time the data transfer. Under these circumstances, the internal clock signal must be relatively stable as soon as clock buffer 544 is activated in response to the falling edge of $\overline{\text{CKE}}$.

In an alternate embodiment, DRAM 520 includes address transition detect circuitry, thus avoiding the need of separate $\overline{\text{CAS}}$ line 506 and signal. Address transition detect circuitry monitors the address bus 504 to detect transitions in the data that is being sent on the address bus 504. When a transition is detected, DRAM 520 restarts the timing chains 530 causing data corresponding to a new address to fall out of the column I/O circuits 562.

Multi-Mode Clock Generation Circuit

As mentioned above, DRAM 520 supports a synchronous data transfer mode, a slow synchronous data transfer mode, and an asynchronous data transfer mode. The current data transfer mode determines the signal at the output of clock generation circuit 570. The mode is selected by mode control circuit 566, which may be, for example, a value in a register within DRAM 520 or a pin connected to an external control line.

Figure 5B:
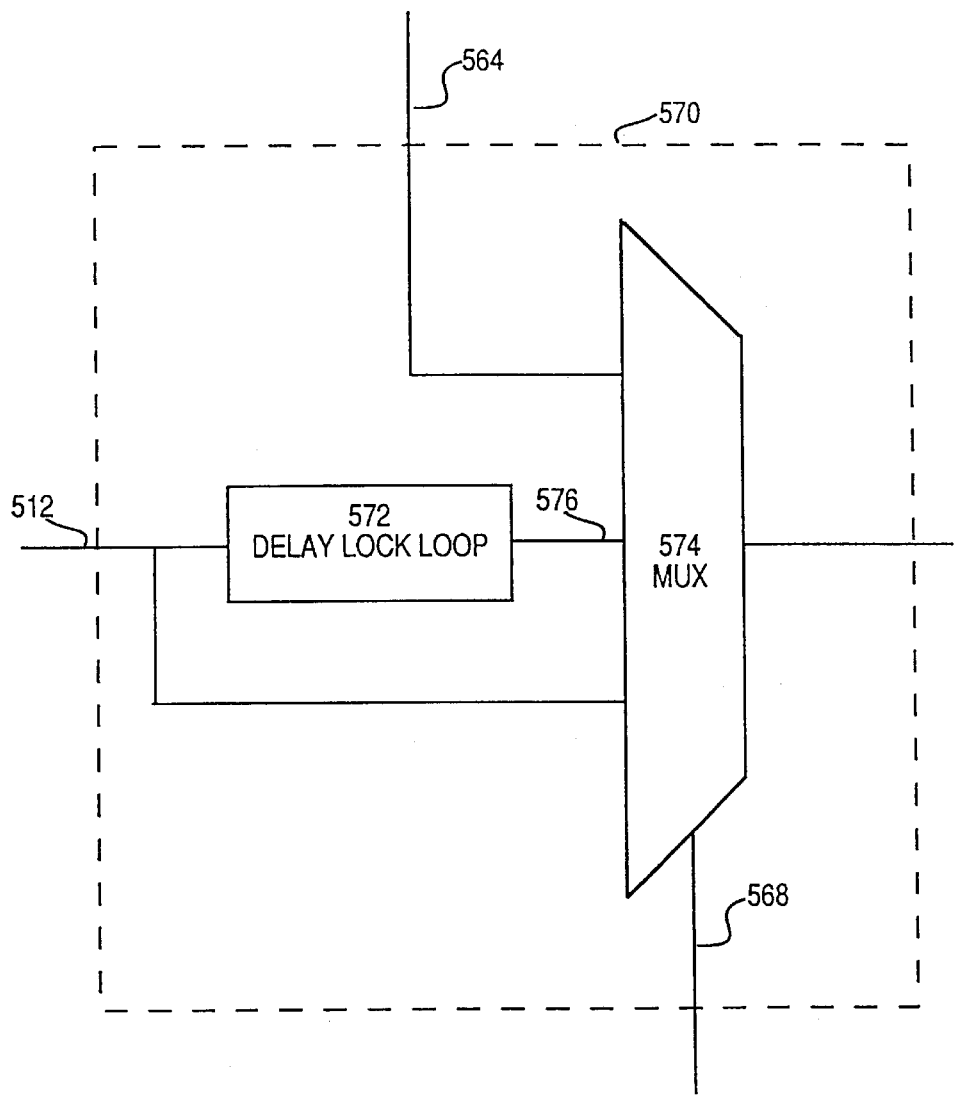
FIG. 5b is a block diagram illustrating the clock generation circuitry of FIG. 5a in greater detail.

Referring to FIG. 5b, it is a block diagram illustrating a clock generation circuit 570 according to one embodiment of the invention. Clock generation circuit 570 includes a multiplexer 574 with three inputs and one output. The inputs are coupled to lines 564, 576 and 512. The output of multiplexer 574 feeds the input of clock buffer 544. The multiplexer 574 is controlled by the control signal sent by the mode control circuit 566 over line 568.

When mode control circuit 566 applies a signal associated with the asynchronous transfer mode over line 568, the signal on $\overline{\text{CAS}}$ line 506 passes from line 564 through multiplexer 574 to the input of clock buffer 544. When mode control circuit 566 applies a signal associated with the synchronous transfer mode over line 568, the output of a delay lock loop (DLL) 572 whose input is the external clock signal on line 512 passes through multiplexer 574 to the input of clock buffer 544. When mode control circuit 566 applies a signal associated with the slow synchronous transfer mode over line 568, the external clock signal on line 512 passes through multiplexer 574 to the input of clock buffer 544.

Clock Activation

Returning again to the transaction illustrated in FIG. 6, the memory controller 518 causes the signal on the $\overline{\text{CKE}}$ line 514 to go LOW at time T2. When the $\overline{\text{CKE}}$ line 514 goes LOW, the flip flop 540 turns on the clock buffer 544. The signal at the output of clock generation circuit 570 begins driving clocked buffer 536 and finite state machine 538 through the clock buffer 544 when the clock buffer 544 is on. Assuming that DRAM 520 is in either synchronous mode or slow synchronous mode, the signal at the output of clock generation circuit 570 will reflect a clock signal on line 512, as shown in FIG. 6.

In FIG. 6, the "internal clock signal" is the signal generated at the output of the clock buffer 544. The internal clock signal generated by clock buffer 544 typically takes a few cycles to stabilize. Therefore, the signal on line 546 does not immediately reflect the clock signal on line 512. In the illustrated example, the signal on line 546 does not stabilize until some time has elapsed after T2.

In the illustrated read transaction, the source of the clock signal on line 512 is not activated until time T2. By turning off the source of the external clock signal when no data transfers are in progress, both the external clock source and DRAM 520 conserve power when data transfer operations are not being performed. In alternative embodiments, the source of the external clock signal on line 512 remains on, while the internal clock signal on line 546 is only turned on when DRAM 520 is actually involved in a data transfer, as described above.

Synchronizing the Timing

After time T3, the DRAM 520 has all the information it requires to transmit data from the specified row and column, but does not yet know when to begin sending the data. In conventional SDRAMs, the timing of the data transfer is based on the timing of the data transfer request. Thus, if a controller sends a data transfer request on a particular clock cycle, then the controller knows that the requested data transfer will begin a predetermined number of clock cycles after the particular clock cycle.

In system 500, the data transfer requests are transmitted in an asynchronous manner. In fact, the clock source whose signal is used to time synchronous data transfers may not even be active at the time the $\overline{\text{RAS}}$ and $\overline{\text{CAS}}$ signals are transmitted. Therefore, the transmission of information other than the data itself (e.g. $\overline{\text{CAS}}$, $\overline{\text{RAS}}$, address information, $\overline{\text{WE}}$, etc.) need not be associated with any particular clock cycle or mode. Consequently, DRAM 520 cannot time the transmission of data based on a clock cycle on which the $\overline{\text{RAS}}$ or $\overline{\text{CAS}}$ signals were transmitted, and memory controller 518 cannot use a clock cycle on which the $\overline{\text{RAS}}$ or $\overline{\text{CAS}}$ signals were transmitted to determine the clock cycle on which DRAM 520 will begin sending data According to one embodiment of the invention, the rising edge of the $\overline{\text{CKE}}$ signal is used as a timing mark to indicate to the finite state machine 538 of DRAM 520 when to begin sending requested data. Specifically, the clock buffer 544 is activated at the falling edge of the $\overline{\text{CKE}}$ signal (at time T2) as described above. The memory controller 518 continues to generate the LOW $\overline{\text{CKE}}$ signal. After the clock signal from the clock buffer has stabilized, the memory controller 518 causes the $\overline{\text{CKE}}$ signal to go HIGH. The time at which the $\overline{\text{CKE}}$ signal goes HIGH is used by memory controller 518 and the finite state machine 538 as a timing mark.

According to an alternate embodiment, a control line separate from the $\overline{\text{CKE}}$ line 514 may be used to provide the timing mark. In an embodiment that uses a separate control line for the timing mark, $\overline{\text{CKE}}$ might be full swing CMOS while the timing mark is low swing high speed signal.

In the illustrated read transaction, the first timing mark occurs at time T4. In one embodiment, the finite state machine 538 begins the transmission of the requested data a predetermined number of clock cycles after the timing mark, and memory controller 518 knows to expect the data from DRAM 520 the predetermined number of clock cycles after the timing mark. The predetermined number may be a fixed constant, or a value stored in a register within DRAM 520.

In the illustrated embodiment, the $\overline{\text{WE}}$ signal is sampled at the first rising edge of the clock signal after $\overline{\text{CKE}}$ is sampled HIGH. The sample of $\overline{\text{WE}}$ is used to determine whether the transaction is going to be a read transaction or a write transaction. In the example shown in FIG. 6, $\overline{\text{WE}}$ is HIGH on the first rising edge of the clock signal after $\overline{\text{CKE}}$ goes HIGH, indicating that the data transfer is going to be a read transaction.

In an alternate embodiment, the $\overline{\text{WE}}$ signal can be sampled at the falling edge of $\overline{\text{CKE}}$. To increase transmission bandwidth, the input receive path of DRAM 520 and the output transmit path of DRAM 520 can be separately compensated. For example, clock generation circuit 570 and clock buffer 544 may be replaced with two clock generation circuit/clock buffer combinations, where one clock generation circuit/clock buffer combination is used to drive clocked buffer 536 to receive data and a different clock generation circuit/clock buffer combination is used to drive clocked buffer 536 to transmit data. Power is saved by activating only the clock generation circuit/clock buffer combination that will be involved in the transfer. By sampling the $\overline{WE}$ signal at the falling edge of $\overline{CKE}$, the DRAM has more time between when the type of transaction (read or write) is known and when the data transfer will begin. During this interval the DRAM activates the clock buffer that corresponds to the type of transaction to be performed.

The Synchronous Data transfer

As mentioned above, the finite state machine 538 causes data from the specified column of the specified row to be sent over the data bus 510 a predetermined number of clock cycles after the timing mark. The delay between a $\overline{CAS}$ signal and the transmission of data must be long enough for the data from the appropriate column to be loaded through the column I/O circuits 562 into the clocked buffer 536. In the illustrated example, each column address corresponds to eight bytes. However, a packet size of eight bytes is merely exemplary. The actual size of data packets will vary from implementation to implementation. The present invention is not limited to any particular size of data packet.

In response to the $\overline{CAS}$ signal, eight bytes that correspond to the specified column address are loaded through the column I/O circuits 562 into clocked buffer 536. During a data transfer, finite state machine 538 causes the eight bytes to be sent sequentially (per data bus width) from the clocked buffer 536 to the data bus 510. The clock signal from the clock buffer 544 determines the timing of the transmission of the eight bytes. In the illustrated example, two bytes are sent per clock cycle, beginning a time T5. The same clock signal is applied to a clocked buffer 550 in the memory controller 518. The eight bytes of data are sequentially received at the clocked buffer 550 based on the timing of the clock signal.

In the embodiment described above, data is transferred through column I/O circuits 562 to clocked buffer 536 eight bytes at a time, and transferred out of clocked buffer 536 to clocked buffer 550 one byte at a time. Consequently, in this embodiment, clocked buffer 536 may be a parallel to serial shift register, while clocked buffer 550 may be a serial to parallel shift register. The buffer circuits used to perform the transfer function may vary from implementation to implementation. The present invention is not limited to any particular type of clocked buffers, nor any particular clock speeds or bandwidths used to transfer data within DRAM 520 or between DRAM 520 and memory controller 518.

Shutdown After a Data Transfer

As mentioned above, the synchronous components within DRAM 520 begin to be driven at time T2 by the clock signal on line 512. While these components are being driven by the clock signal, the DRAM 520 continues to consume relatively large amounts of power. DRAM 520 would continue to consume large amounts of power even when DRAM 520 is not involved in a data transfer if the DRAM 520 is not isolated from the clock signal on line 512 after the completion of a data transfer. Therefore, finite state machine 538 contains a mechanism for turning off clock buffer 544 after all of the outstanding data transfer operations that involve DRAM 520 have been completed.

According to one embodiment of the invention, finite state machine 538 uses a countdown timer to determine when to turn off the clock buffer 544. Specifically, upon detecting tie timing mark, finite state machine 538 stores a count value in a countdown timer and begins decrementing the count value during each clock cycle. As shall be explained in greater detail below, the countdown timer is incremented or reloaded for each data block in multiple-block transfers. When count value of the countdown timer reaches zero, the finite state machine 538 sends a signal to flip flop 540 over a line 542 to cause the flip flop 540 to turn off the clock buffer 544. When clock buffer 544 is turned off, the synchronous components of DRAM 520 cease to be driven by the clock signal on line 512, causing DRAM 520 to assume a state in which little power is consumed.

Alternative embodiments may use other mechanisms for turning off the clock buffer 544 when all data transfers involving the DRAM 520 have been completed. For example, logic circuits within finite state machine 538 may be configured to detect the completion of a data transfer operation and determine whether there is any outstanding transaction that involves DRAM 520. If there is an outstanding transaction, then the finite state machine 538 transmits the appropriate signals to the clocked buffer 536 to perform the outstanding transaction. If there are no outstanding transactions that involve DRAM 520, then the finite state machine 538 sends a signal to the flip flop 540 to cause the clock buffer 544 to be turned off.

Asynchronous Data Transfer Mode

To achieve high data transfer rates, synchronous transfers can be performed as described above. However, under certain conditions it may be desirable to avoid the relatively high power consumption requirements of DLL 572 by performing data transfers asynchronously.

To perform asynchronous data transfers, mode control circuit 566 applies a control signal to line 568 to cause the signal on $\overline{CAS}$ line 506 to be generated at the output of clock generation circuit 570, as described above. Memory controller 518 may then toggle the $\overline{CAS}$ signal without introducing any new address information on address bus 504, causing the $\overline{CAS}$ signal to act as a clock to drive clocked buffer 536.

In an alternate embodiment, asynchronous transfers may be performed by placing the clocked buffer 536 in flow-through. To address the width mismatch between the internal data bus 523 and the external data bus 510, the memory controller 518 presents sufficient addressing information to the DRAM 520 to select a single byte from the eight bytes loaded on the sense amplifier array 560.

Slow Synchronous Data Transfer Mode

Even when synchronous data transfers are desired, the delay lock loop circuit 572 within clock generation circuit 570 may be bypassed to reduce power consumption. To bypass DLL 572, mode control circuit 566 applies a control signal to line 568 to cause the signal on line 512 to be generated at the output of clock generation circuit 570, as described above.

However, DRAM 520 cannot support the same transfer rate without the clock synchronization provided by the DLL 572 as it can with a clock synchronized by the DLL 572. Consequently, when the DLL 572 is bypassed, a slower clock signal must be used to perform the synchronous data transfers. Due to the lower clock frequency, the synchronous data transfers take longer than when the DLL 572 is used. Consequently, DRAM 520 is said to be in "slow" synchronous data transfer mode when an external clock signal that has not been phase compensated by a DLL is used to drive the data transfers.

Multiple-Block Transfer

In an embodiment that uses a countdown timer, the seed count value used by the countdown timer is based on the amount of time required for DRAM 520 to send one packet of data (eight bytes in the illustrated example). Specifically, after the timing mark is detected, the clock buffer 544 must stay on long enough for a packet of data to be accessed, loaded, and transmitted from DRAM 520. If a new column address arrives before data from the previous column address has been completely transferred, then the clock buffer 544 should stay on until the data from the new column address has been transmitted.

To prevent clock buffer 544 from being turned off between consecutive packet transfers, the finite state machine 538 adds a predetermined value to the count value in the countdown timer upon detecting a falling edge of the $\overline{\text{CKE}}$ signal. Because the count value in the countdown timer is increased, a greater number of clock cycles will elapse before the count value reaches zero. Preferably, the predetermined value that is added to the count value causes the shutdown of the clock buffer 544 to be delayed long enough for the additional packet of data to be transferred.

In an alternate embodiment, a predetermined value is loaded into the countdown timer upon detecting a falling edge of the $\overline{\text{CKE}}$ signal. The predetermined value is large enough to ensure that the countdown timer will not reach zero before a packet of data is transferred. During the transfer of multiple data packets the counter will repeatedly be reloaded and thus never reach zero.

FIG. 6 illustrates the timing of a read transaction in which two data packets are transferred. At time T2 the count value in the countdown timer is set to a value that ensures that the clock buffer 544 will be on long enough for one packet of data to be transferred. In the illustrated example, the count value will be set to a value that ensures that the clock buffer 544 remains on until time T8.

At time T5, the finite state machine 538 adds or reloads a predetermined number to the count value in response to detecting the falling edge of the $\overline{\text{CKE}}$ signal. At time T8 the transmission of the first packet of data is completed. Because the predetermined value was added to the count value or the counter was reloaded, the finite state machine 538 does not turn off the clock buffer at T8. Rather, the count value does not reach zero until after time T9, when the packet of data from the second column has been completely transferred.

According to an alternate embodiment of the invention, finite state machine 538 contains logic for keeping track of how many CAS requests remain to be serviced. Upon detecting the falling edge of the $\overline{\text{CKE}}$ signal, the finite state machine 538 increments the outstanding request value. Upon completing the transfer of one data block, the finite state machine 538 decrements the outstanding request value. When the outstanding request value is zero, the finite state machine 538 turns off the clock buffer 544.

Write Transaction Timing

Figure 7:
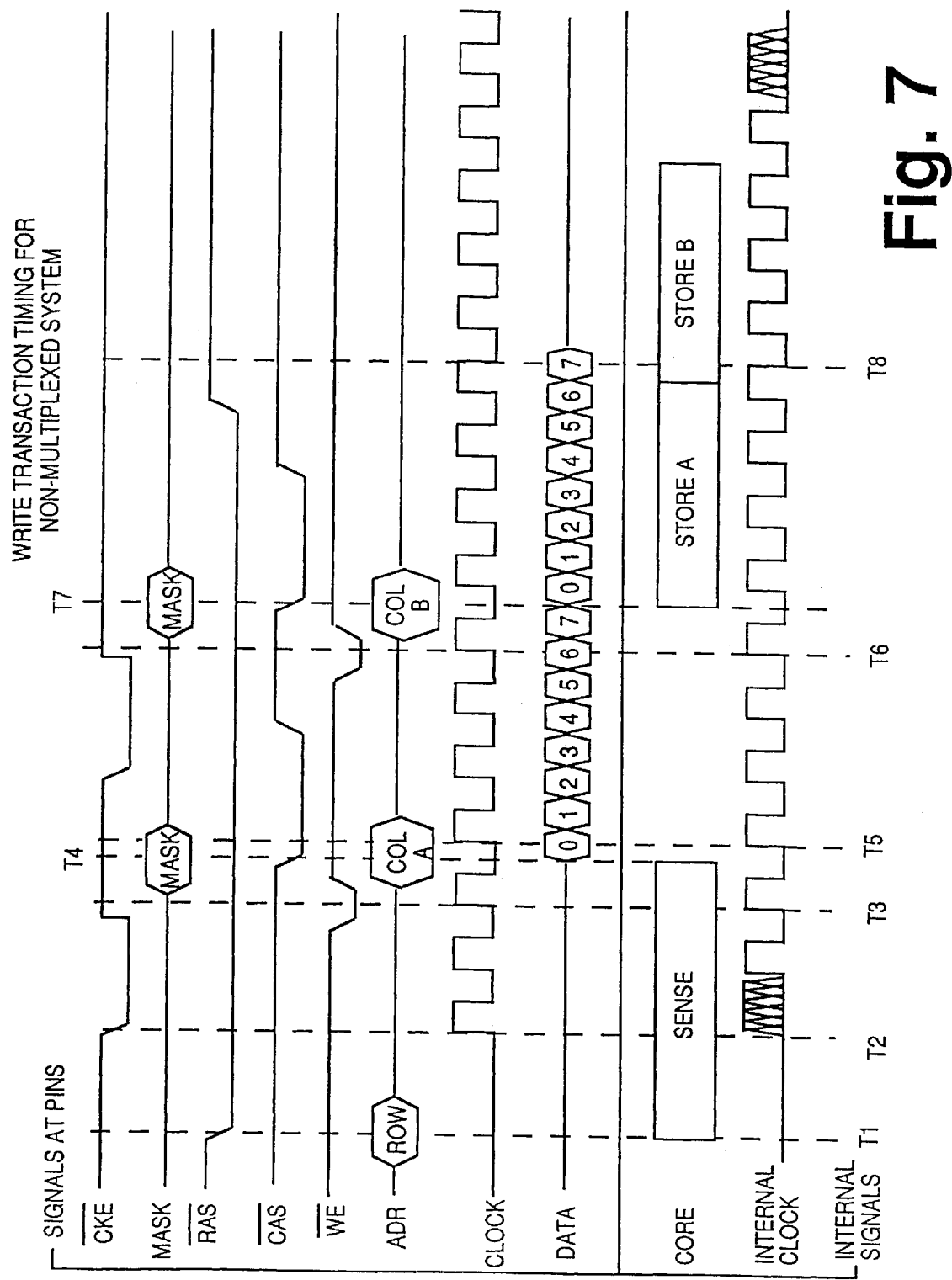

FIG. 7 is a timing diagram of the signals generated in system 500 during a two packet write transaction. At time T1, an address on address bus 504 is transferred from latch 532 to row decoder 526 when the $\overline{\text{RAS}}$ signal on line 502 goes LOW. At time T2, the $\overline{\text{CKE}}$ signal on line 514 goes LOW causing the flip flop 540 to activate the clock buffer 544. The finite state machine 538 detects the rising edge of the $\overline{\text{CKE}}$ signal to determine that time T3 (the rising edge of the $\overline{\text{CKE}}$ signal) is the timing mark for the first packet transfer.

The $\overline{\text{WE}}$ signal is sampled on the first clock cycle after the rising edge of the $\overline{\text{CKE}}$ signal to determine whether the transaction is going to be a read transaction or a write transaction. In the present example, $\overline{\text{WE}}$ is LOW at the rising edge of the first clock cycle after the $\overline{\text{CKE}}$ signal goes HIGH, indicating that the data transfer is going to be a write transaction.

At time T4, $\overline{\text{CAS}}$ goes LOW indicating to DRAM 520 that the data bus 510 has data that is to be written to the column that corresponds to the address on the address bus 504. In the illustrated example, the address on the address bus at time T4 specifies column A. The DRAM also receives the mask data on lines 508. The finite state machine 538 controls the clocked buffer 536 to cause the data to be synchronously stored in column A in the sense amplifier array 560. Finite state machine 538 knows to expect the data at time T5 because time T5 is a predetermined number of clock cycles (e.g. one clock cycle) after the timing mark.

A timing mark occurs at time T6, the first clock cycle after another rising edge of the $\overline{\text{CKE}}$ signal. At time T6 the $\overline{\text{WE}}$ signal is sampled. In the illustrated example, the $\overline{\text{WE}}$ signal is LOW at time T6 indicating a second column of data is to be written to DRAM 520. When receipt of the first packet of data is complete, the received data is stored in column A of the appropriate row of the memory array 524.

At time T7, $\overline{\text{CAS}}$ goes LOW, indicating to DRAM 520 that the data bus 510 has data that is to be written to the column that correspond to the address on the address bus 504. In the illustrated example, the address on the address bus 504 at time T7 specifies column B. The finite state machine 538 controls the clocked buffer 536 to cause the data to be synchronously received into column B of the sense amplifier array 560. Finite state machine 538 knows to expect the data at time T7 because time T7 is a predetermined number of clock cycles after the second timing mark at time T6. At time T8 the second packet of data has been completely received, so the DRAM 520 stores the second packet of data in column B of the appropriate row within memory array 524.

Figure 8:
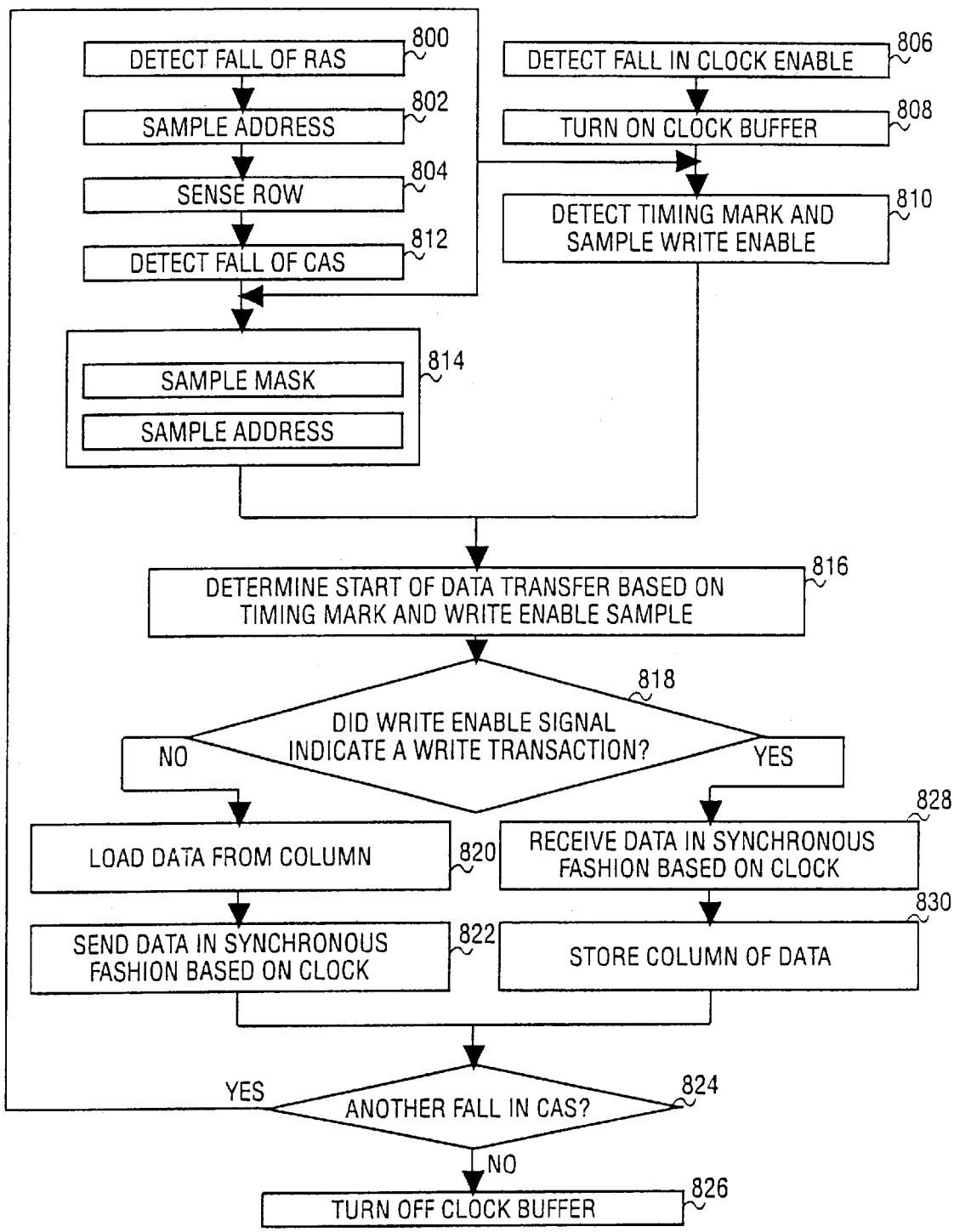

FIG. 8 is a flowchart illustrating the operation of system 500 according to an embodiment of the invention. Initially, DRAM 520 is in a powered down state where clock buffer 544 is off. At step 800, the DRAM 520 detects the fall of the $\overline{\text{RAS}}$ signal. The fall of the $\overline{\text{RAS}}$ signal causes the address on the address bus 504 to be sampled (i.e. sent from latch 532 to row decoder 526) at step 802. At step 804 the core of DRAM 420 senses the row of data that corresponds to the address sampled at step 802.

At step 812, the DRAM 520 detects the falling edge of the $\overline{\text{CAS}}$ signal. In response to detecting the falling edge of the $\overline{\text{CAS}}$ signal, DRAM 520 samples the mask signals on lines 508 and the column address on the address bus 504 (step 814).

Steps 800, 802, 804, 812 and 814 are performed asynchronously and therefore do not require an active clock signal. Steps 806, 808 and 810 may occur before, in parallel with, or after steps 800, 802, 804, 812 and 814, and therefore are shown as a separate thread of execution.

At step 806, the $\overline{\text{CKE}}$ signal goes LOW causing the clock buffer to be turned on at step 808. At step 810 the DRAM 520 detects a timing mark. In the embodiment described above, the timing mark is detected when the finite state machine 538 senses the start of the first clock cycle subsequent to the rising edge of the $\overline{\text{CKE}}$ signal. The $\overline{\text{WE}}$ signal is sampled at this time to determine whether the data transfer is going to be a read transaction or a write transaction.

At step 816, the finite state machine 538 determines the clock cycle on which the data transfer is to begin based on when the timing mark was detected and whether the transaction is a write transaction or a read transaction.

At step 818, it is determined whether the $\overline{\text{WE}}$ signal sampled at step 810 indicated that the transaction is a write transaction. The $\overline{\text{WE}}$ signal sampled at step 810 indicated that the transaction is a write transaction, then control proceeds to step 828. Otherwise, control proceeds to step 820.

Significantly, all of the steps performed up to step 816 are performed in an asynchronous manner. The use of an asynchronous mechanism to perform these steps reduces the latency between the fall of the $\overline{\text{RAS}}$ signal and the time that the appropriate row of data is sensed. By the time step 810 has been performed, the clock buffer 544 has been on long enough to provide a stable clock signal that may be used to synchronously transfer the data involved in the transaction.

At step 820 the core of DRAM 520 loads into an output buffer (e.g. clocked buffer 536) the data block from the column specified in the address sampled at step 814. At step 822 the data block is transmitted from the output buffer to the memory controller 518 in a synchronous fashion based on the clock signal from clock buffer 544. At step 824 it is determined if the $\overline{\text{CAS}}$ signal went LOW again. If so, then an additional packet of data is to be sent in the current read transaction. Control therefore returns to steps 810 and 814. If the $\overline{\text{CAS}}$ signal did not go LOW again, then the last packet of data for the transaction has been transmitted, and the clock buffer 544 is turned off at step 826.

Control proceeds to step 828 if the transaction is a write transaction. At step 828, DRAM 520 receives data through clocked buffer 536 which is driven by the clock signal from clock buffer 544. When the packet of data has been received, the packet of data is stored in the memory array 524 of DRAM 520 at step 830. At step 824 it is determined if the $\overline{\text{CAS}}$ signal went LOW again subsequent to steps 810 and 812. If so, then an additional packet of data is to be received in the current write transaction. Due to the asynchronous control circuitry of DRAM 520, the clock does not have to be operating to perform a memory cell refresh operation. Control therefore returns to step 814. If the $\overline{\text{CAS}}$ signal did not go LOW subsequent to step 812, then the last packet of data for the transaction has been received, and the clock buffer 544 is turned off at step 826.

It should be noted that an assertion of $\overline{\text{RAS}}$ may be followed by any arbitrary read/write sequence. For example, $\overline{\text{RAS}}$ may go LOW to cause a particular row of data to be loaded into sense amplifier array 560. Subsequently, a series of mixed reads and writes may be performed on the row of data. In addition, an arbitrary amount of time may elapse between $\overline{\text{CAS}}$ signals. The duration of $\overline{\text{RAS}}$ and the delay between CAS operations is limited only by core considerations such as refresh rates.

Multiple-Dram Systems

The memory system 500 of FIG. 5*a* includes only one DRAM 520. However, the present invention is not limited to memory systems with any particular number of DRAMs. Additional DRAMs may be added to memory system 500 without affecting the operations described above. Each of the DRAMs would be connected to memory controller 518 by its own private $\overline{\text{CAS}}$ line, $\overline{\text{RAS}}$ line and $\overline{\text{CKE}}$ line. All of the other lines that connect the DRAMs to the memory controller 518 may be shared.

In an alternate embodiment, a memory system has a two dimensional array of memory chips. In such an embodiment, all DRAMs that belong to the same column of the two dimensional array would share the same set of control lines, while each row of DRAMs in the two dimensional array would have its own set of control lines.

Multiplexed Embodiments

In the embodiment illustrated in FIG. 5*a*, the throughput is maximized by providing separate lines for each type of signal so that the signals which are separated can function simultaneously. However, as a general rule, the higher the number of lines required by a memory system, the more expensive it is to manufacture the components for the memory system. Therefore, the approach shown in FIG. 5*a* may not be optimal when the cost of manufacturing is taken into account. In an alternative embodiment to that shown in FIG. 5*a*, the number of lines is reduced by multiplexing some of the lines to allow the same lines to carry more than one type of signal.

Figure 9:
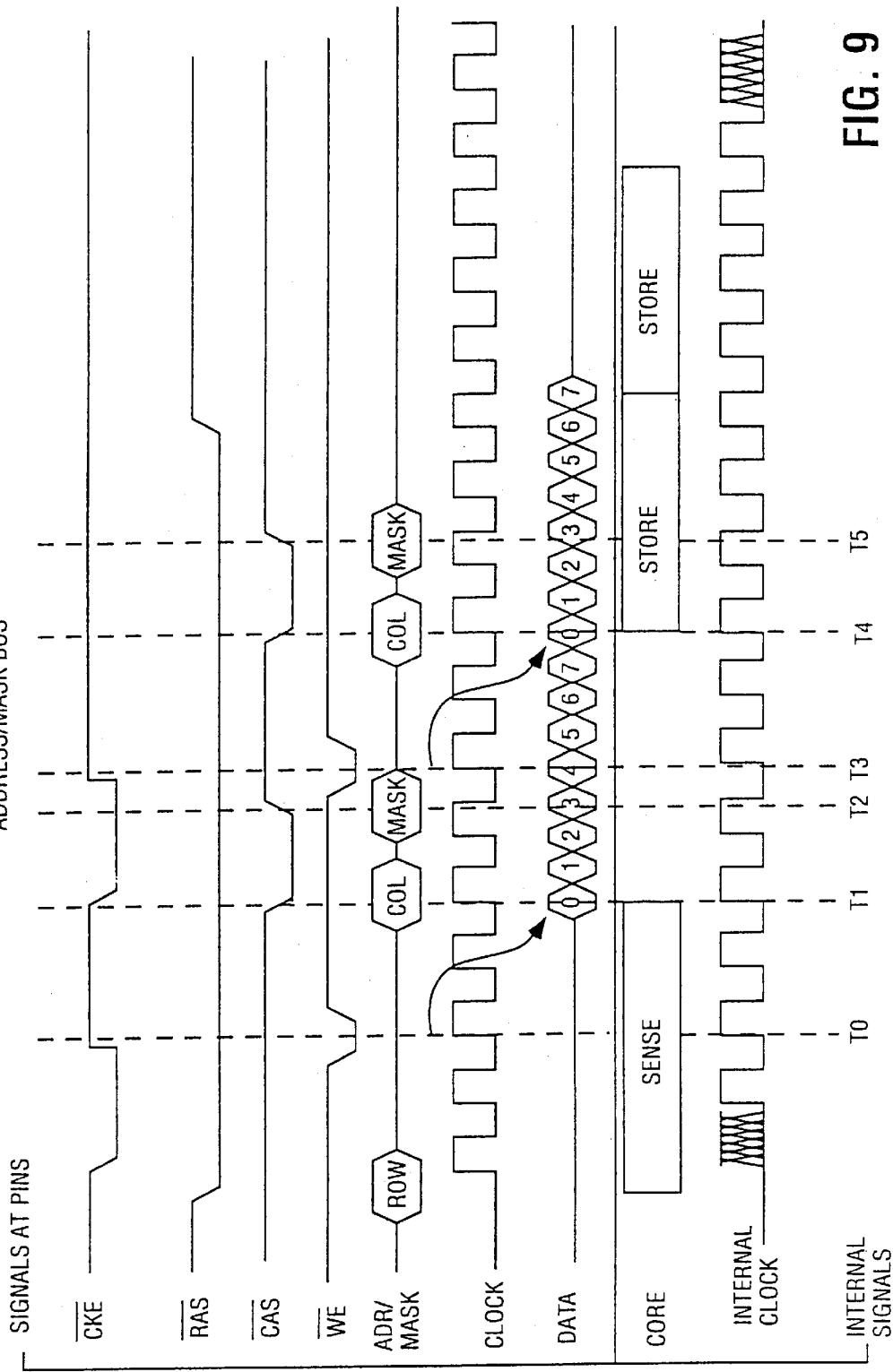
FIG. 9 is a timing diagram illustrating the timing of signals during a read transaction in a memory system in which the mask and address signals are multiplexed over the same set of lines.

According to an alternative embodiment, the mask signal can be sent over the address bus 504, eliminating the need for mask lines 508. FIG. 9 is a timing diagram illustrating the timing of the signals generated during a write operation in such an embodiment. The timing proceeds in the same fashion as described above with reference to FIG. 7 with the difference that the mask signal is not sent over a mask bus at the same time as the column address is sent over the address bus. Rather, both the address and the mask bits are sent over a combined address/mask bus, where the address bits precede the corresponding mask bits.

Similar to memory system 500, the memory controller in a combined address/mask bus embodiment indicates to the DRAM that the column address is present on the address/mask bus by causing the $\overline{\text{CAS}}$ signal to go LOW (at times T1 and T4). The memory controller indicates to the DRAM that the transaction is a write transaction by causing the $\overline{\text{WE}}$ signal to be LOW at the start of the clock cycle after the rising edge of the $\overline{\text{CKE}}$ signal. In addition, the memory controller indicates the presence of the mask bits on the address/mask bus (at times T2 and T5) by causing the $\overline{\text{CAS}}$ signal to go HIGH. When the DRAM detects the rising edge of the $\overline{\text{CAS}}$ signal, the DRAM reads the mask bits from the address/mask bus.

In an alternate combined address/mask bus embodiment, the memory controller indicates the presence of the mask bits on the address/mask bus by causing the $\overline{\text{WE}}$ signal to go HIGH. When the DRAM detects the rising edge of the $\overline{\text{WE}}$ signal, the DRAM reads the mask bits from the address/mask bus. When the rising edge of $\overline{\text{WE}}$ is used to indicate the presence of mask bits, the mask bits for the transfer of a particular data block must be placed on the combined address/mask bus at the rising edge of $\overline{\text{WE}}$ that corresponds to the transfer of the particular data block. In FIG. 9, for example, the mask bits associated with the data block that is transferred beginning at T1 would be placed on the combined address/mask bus to be read at the first rising edge of $\overline{\text{WE}}$ after time T0. Similarly, the mask bits associated with the data block that is transferred beginning at T4 would be placed on the combined address/mask bus to be read at the first rising edge of $\overline{WE}$ after time T3.

For read transactions, mask bits are not transmitted. Therefore, read transactions in a combined address/mask bus embodiment proceed as illustrated in FIG. 6, with the exception that the separate mask signal does not exist.

In alternative embodiments, addresses may be multiplexed even though a separate address bus is provided. For example, row addresses may be sent over the separate address bus while column addresses are multiplexed on the same bus that carries data. Similarly, column addresses may be sent over the separate address bus while row addresses are multiplexed on the same bus that carries the data.

Read Transaction in a Multiplexed Data/address/mask Bits Embodiment

Figure 10:
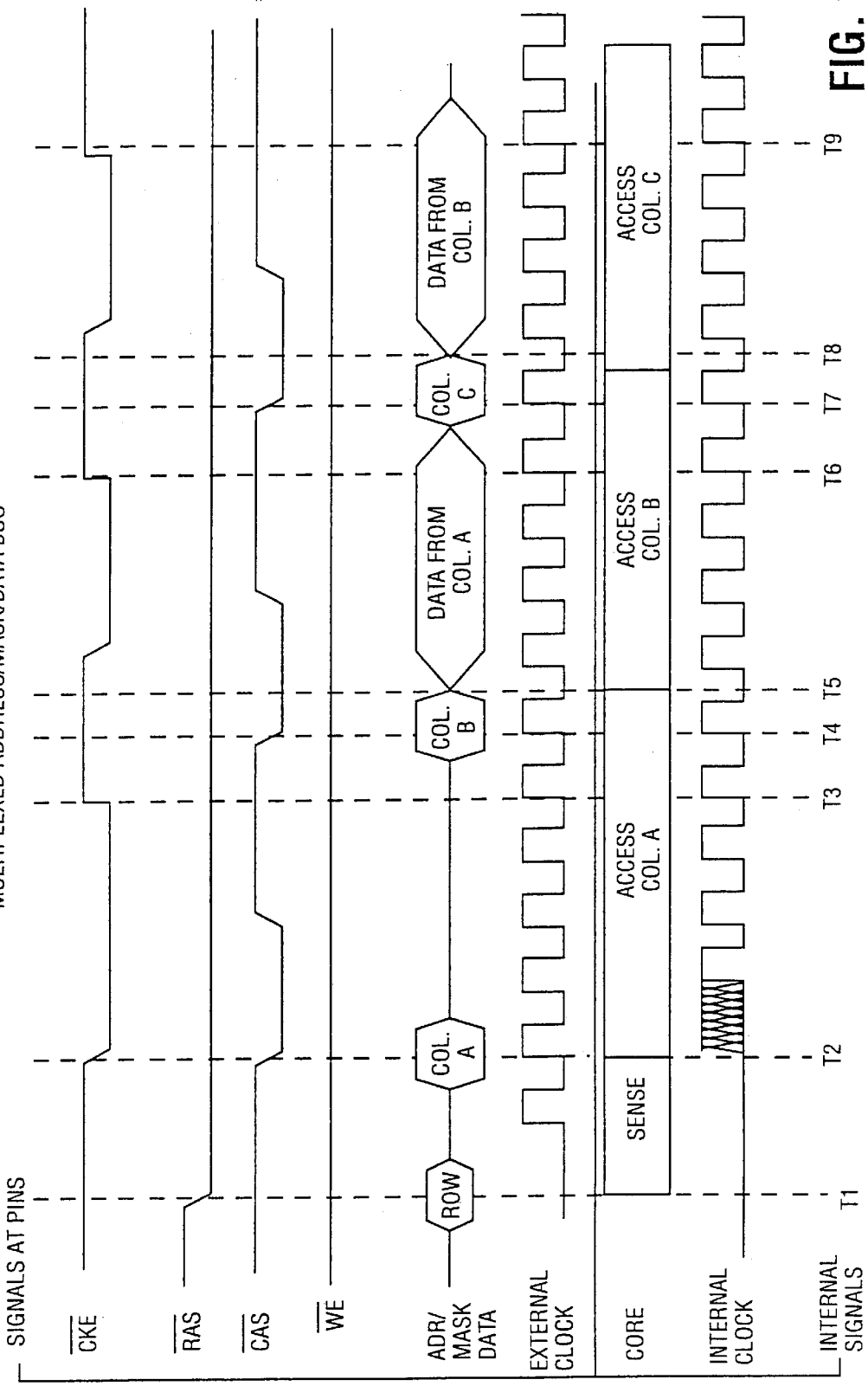
FIG. 10 is a timing diagram illustrating the timing of signals during a read transaction in a memory system in which the mask, address and data signals are multiplexed over the same lines.

The number of lines required by a memory system that implements the present invention may be further reduced by using the same set of lines to transmit the data, address and mask bits. FIG. 10 illustrates the timing of signals generated during a read transaction in an embodiment in which the data, address and mask bits are transmitted over a combined bus.

Referring to FIG. 10, at time T1 the $\overline{RAS}$ signal goes LOW to indicate to the DRAM that a row address is on the combined bus. The DRAM reads the row address and begins a sense operation to load the appropriate row of data into the sense amplifier array. At time T2, the $\overline{CAS}$ signal goes LOW to indicate to the DRAM that a column address is on the combined bus. In the illustrated example, the column address on the combined bus at time T2 specifies column address A. Also at time T2, the signal goes LOW to turn on the clock buffer within the DRAM.

The memory controller causes the $\overline{CKE}$ signal to go HIGH to indicate that time T3 is the timing mark for the transfer of data from column address A. At time T4, the $\overline{CAS}$ signal goes LOW to indicate to the DRAM that a column address is on the combined bus. In the illustrated example, the column address on the combined bus at time T4 specifies column address B. At time T5, the data from column address A begins to be placed on the combined bus. The memory controller knows to expect the data from column address A at time T5 because the time at which the data from column address A is placed on the combined bus is determined by the timing mark at time T3. Also at time T5, the DRAM core begins to access the data from column address B.

The memory controller causes the $\overline{CKE}$ signal to go HIGH to indicate that T6 is the timing mark for the transfer of data from column address B. At time T7, the $\overline{CAS}$ signal goes LOW to indicate to the DRAM that a column address is on the combined bus. In the illustrated example, the column address on the combined bus at time T7 specifies column address C. At time T8, the data from column address B begins to be placed on the combined bus. The memory controller knows to expect the data from column address B at time T8 because the time at which the data from column address B is placed on the combined bus is determined by the timing mark at time T6. Also at time T8, the DRAM core begins to access the data from column address C. This process may be repeated to transfer any arbitrary number of columns of data. Each falling edge in the $\overline{CAS}$ signal initiates a transfer that constitutes an independent transaction, and continues until the entire set of read and write transactions have been completed.

Write Transaction in a Multiplexed Data/address/mask Bits Embodiments

Figure 11:
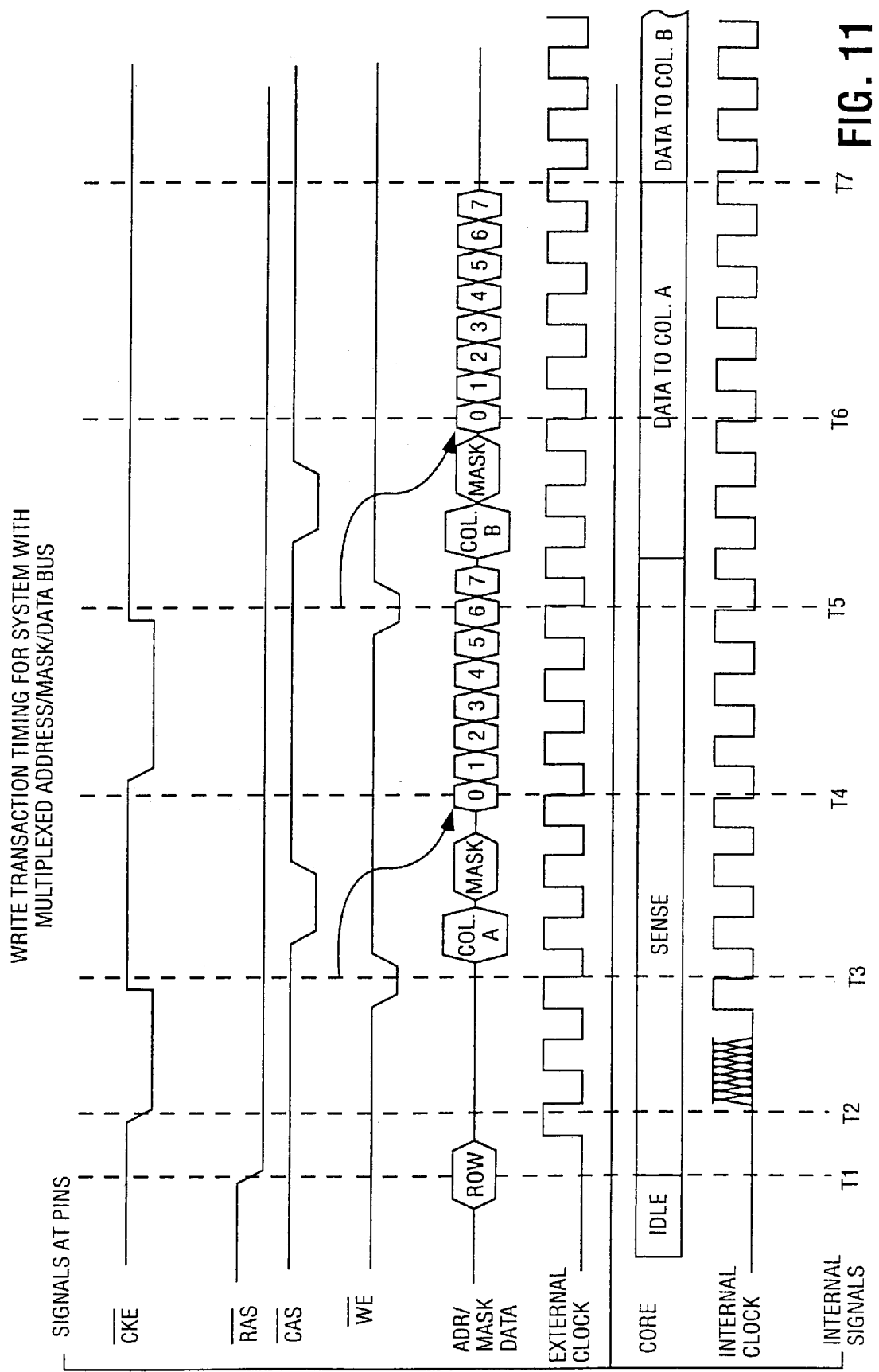
FIG. 11 is a timing diagram illustrating the timing of signals during a write transaction in a memory system in which the mask, address and data signals are multiplexed over the same lines.

FIG. 11 illustrates the timing of signals generated during a write transaction in an embodiment in which the data, address and mask bits are transmitted over a combined bus. Referring to FIG. 11, at time T1 the $\overline{RAS}$ signal goes LOW to indicate to the DRAM that a row address is on the combined bus. The row decoder receives the row address and begins a sense operation to load the appropriate row of data into the sense amplifier array. At time T2, the $\overline{CKE}$ signal goes LOW to turn on the clock buffer within the DRAM.

The memory controller causes the $\overline{CKE}$ signal to go HIGH prior to time T3 to indicate that T3 is the timing mark. At time T3 the DRAM samples the $\overline{WE}$ signal to determine that the transaction is a write transaction. The DRAM receives a column address specifying column A when $\overline{CAS}$ goes LOW, and mask data when $\overline{CAS}$ goes HIGH. The transfer of data for column A begins at time T4. The DRAM knows to receive the data for column A at time T4 because clock cycle T4 is a predetermined number of clock cycles after the timing mark (T3). In the illustrated example, data is transmitted three clock cycles after the corresponding timing mark.

The second rising edge of the $\overline{CKE}$ signal indicates to the DRAM that time T5 is a timing mark for a second data transfer operation. The DRAM samples the $\overline{WE}$ signal at time T5 to determine that the second data transfer transaction will be a write transaction.

Independent Sense and Precharge Signals

When a single $\overline{RAS}$ line is connected to a DRAM, only one bank within the DRAM may be sensed at any given time. Therefore, only one sense amplifier array is required per DRAM. To allow more than one bank to be sensed at a time, multiple $\overline{RAS}$ lines can be connected to the DRAM. If each bank within the DRAM has its own $\overline{RAS}$ line, then the controller can independently control (and sense) each of the banks. In such an embodiment, each bank would have its own sense amplifier array. However, the cost of providing a separate line for each bank in each DRAM is significant.

Figure 12:
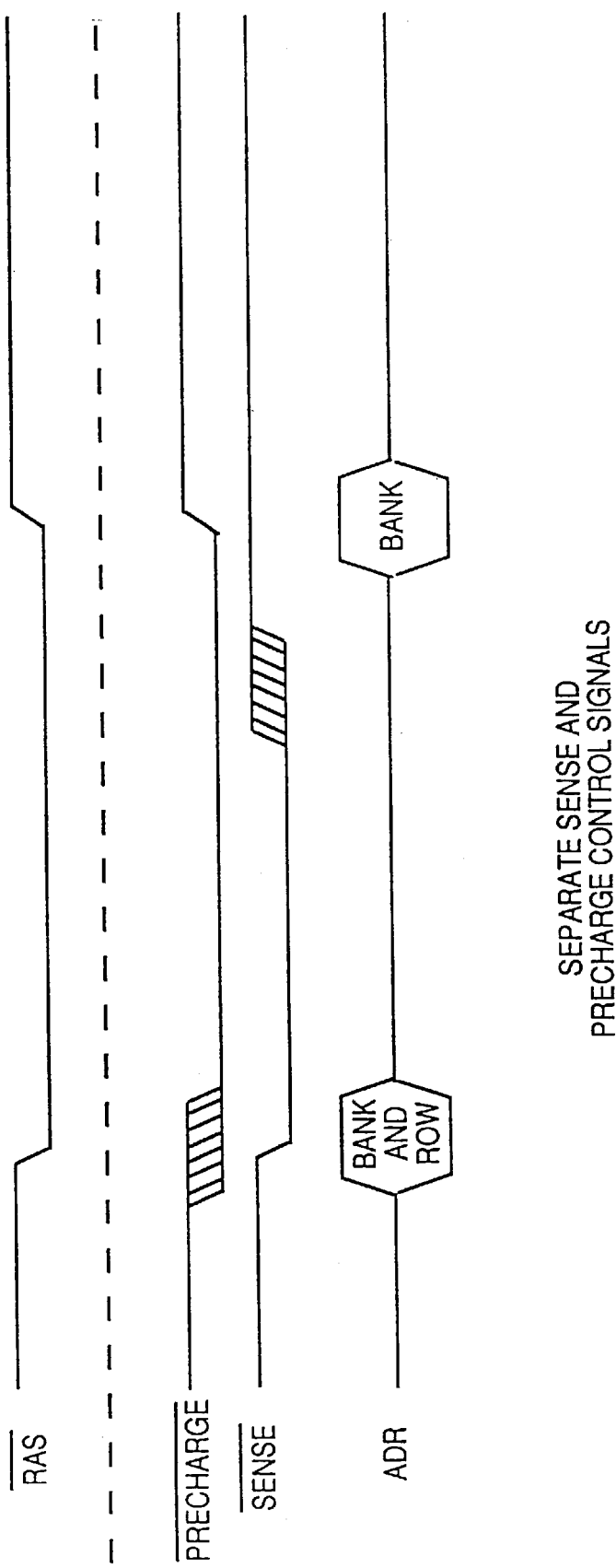
FIG. 12 is a diagram illustrating the correlation between a $\overline{RAS}$ signal and separate PRECHARGE and SENSE signals according to an embodiment of the invention.

To avoid the cost of providing a separate $\overline{RAS}$ line for each back in each DRAM, the $\overline{RAS}$ line may be replaced with separate $\overline{SENSE}$ and PRECHARGE signals. In this embodiment, the memory controller can cause a row within any given bank to be sensed by causing the $\overline{SENSE}$ signal to go LOW while placing an address on the address bus that indicates a particular row and bank within the DRAM. The rising edge of $\overline{SENSE}$ is irrelevant, though a minimum pulse width must be observed. Similarly, any bank may be precharged by causing the PRECHARGE signal to go HIGH while placing an address on the address bus that indicates a particular bank within the DRAM. The falling edge of the PRECHARGE signal is irrelevant. FIG. 12 illustrates the correlation between separate $\overline{SENSE}$ and PRECHARGE signals and a traditional $\overline{RAS}$ signal. In this embodiment, each bank will have its own sense amplifier array, but will not require its own $\overline{RAS}$ line.

In a system that provides separate PRECHARGE and $\overline{SENSE}$ signals, the address that is sent when the $\overline{CAS}$ signal goes LOW includes, in addition to a column address, bits that indicate a particular memory bank. The DRAM transmits data from the specified column of the sense amplifier array that corresponds to the specified memory bank. Thus, in the read transaction described above with reference to FIG. 10, column address A, column address B and column address C may be columns in different memory banks.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A memory device comprising:

a programmable register to store a control value;

internal clock generation circuitry to receive an external clock signal and generate an internal clock signal having a predetermined timing relationship with the external clock signal;

selection circuitry to output the internal clock signal as a selected clock signal when the control value is indicative of a first mode and to output the external clock signal as the selected clock signal when the control value is indicative of a second mode; and output buffer circuitry coupled to output data in response to the selected clock signal, wherein, when the control value is indicative of the first mode, the output buffer circuitry outputs at least a first data value and a second data value in succession during a clock cycle of the external clock signal.

2. The memory device of claim 1 wherein the output buffer circuitry outputs the first and second data values synchronously with respect to consecutive transitions of the external clock signal.

3. The memory device of claim 2 wherein the consecutive transitions of the external clock signal include a rising edge transition followed by a falling edge transition.

4. The memory device of claim 1 wherein the internal clock generation circuitry comprises a delay lock loop to generate a delay lock loop output signal.

5. The memory device of claim 4 wherein the selection circuitry comprises a multiplexer to couple the delay lock loop output signal to the output buffer circuitry when the control value stored in the programmable register is indicative of the first mode.

6. The memory device of claim 1 wherein the selection circuitry comprises a multiplexer to couple the external clock signal to the output buffer circuitry when the control value stored in the programmable register is indicative of the second mode.

7. The memory device of claim 1 wherein the selection circuitry comprises a multiplexer to couple a strobe signal to the output buffer circuitry when the control value stored in the programmable register is indicative of a third mode.

8. The memory device of claim 1 wherein the output buffer circuitry outputs the data in response to a read command, wherein data is output after a number of clock cycles of the external clock signal transpire.

9. The memory device of claim 8 further comprising a register to store a value representative of the number of clock cycles of the external clock signal.

10. The memory device of claim 8 wherein the number of clock cycles of the external clock signal is fixed.

11. The memory device of claim 1 further comprising:

a buffer to receive a strobe signal; and a latch to sample address information upon detection of the strobe signal, wherein the address information specifies a storage location of the data.

12. A memory device having a memory cell array, the memory device comprising:

a programmable register to store a value which is representative of a clock mode;

a delay lock loop circuit to receive an external clock signal and generate a delay lock loop output signal using the external clock signal; and output buffer circuitry to output data in response to the delay lock loop output signal when the value stored in the programmable register is representative of a first clock mode.

13. The memory device of claim 12 wherein the output buffer circuitry outputs the data synchronously with respect to consecutive transitions of the external clock signal.

14. The memory device of claim 13 wherein the consecutive clock transitions include a rising edge transition followed by a falling edge transition of the external clock signal.

15. The memory device of claim 12 further comprising a multiplexer to couple the delay lock loop output signal to the output buffer circuitry when the value stored in the programmable register is representative of the first clock mode.

16. The memory device of claim 12 further comprising a multiplexer to couple the external clock signal to the output buffer circuitry when the value stored in the programmable register is representative of a second clock mode.

17. The memory device of claim 12 further comprising a multiplexer to couple an external strobe signal to the output buffer circuitry when the value stored in the programmable register is representative of a third clock mode.

18. The memory device of claim 12 wherein the value stored in the programmable register is representative of one of a plurality of clock modes.

19. The memory device of claim 12 further comprising:

a buffer to receive a strobe signal; and a latch to sample address information upon detection of the strobe signal, wherein the address information specifies a location within the memory cell array.

20. The memory device of claim 12 wherein the output buffer circuitry outputs the data, in response to a read command, after a number of clock cycles of the external clock signal transpire.

21. The memory device of claim 20 further comprising a register to store a code which is representative of the number of clock cycles of the external clock signal.

22. The memory device of claim 20 wherein the number of clock cycles of the external clock signal is fixed.

23. A method of operation in a memory device having an array of memory cells and a register to store a control value, the method comprises:

receiving an external clock signal;

generating an internal clock signal having a predetermined phase relationship with the external clock signal; and outputting data in response to the internal clock signal when the control value stored in the register is indicative of a first clock mode, wherein at least two data values are output in succession during a clock cycle of the external clock signal when the control value stored in the register is indicative of the first clock mode.

24. The method of claim 23 wherein the data is output synchronously with respect to consecutive clock transitions of the external clock signal.

25. The method of claim 24 wherein the consecutive clock transitions include a rising edge transition followed by a falling edge transition of the external clock signal.

26. The method of claim 23 wherein the data is output in response to an external strobe signal when the control value stored in the register is indicative of a second clock mode.

27. The method of claim 23 wherein the memory device further comprises a clock alignment circuit to receive the external clock signal and generate the internal clock signal.

28. The method of claim 27 wherein the method further comprises bypassing the clock alignment circuit when the value stored in the register is indicative of a third clock mode.

29. The method of claim 23 further comprising receiving a read command, wherein the data is output in response to the read command after a number of clock cycles of the external clock transpire.

30. The method of claim 29 further comprising:

receiving a strobe signal; and sampling address information upon detection of the strobe signal, wherein the address information identifies a location within the array of memory cells.

* * * * *